United States Patent
Guilford et al.

(10) Patent No.: US 10,305,508 B2
(45) Date of Patent: May 28, 2019

(54) SYSTEM FOR COMPRESSING FLOATING POINT DATA

(71) Applicant: Intel Corporation, Santa Clara, CA (US)

(72) Inventors: James D. Guilford, Northborough, MA (US); Vinodh Gopal, Westborough, MA (US); Kirk S. Yap, Westborough, MA (US); Olivia K. Wu, Los Altos, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/977,720

(22) Filed: May 11, 2018

(65) Prior Publication Data

US 2019/0044531 A1   Feb. 7, 2019

(51) Int. Cl.
*H03M 7/00* (2006.01)
*H03M 7/24* (2006.01)
*H03M 7/30* (2006.01)
*G06F 12/0802* (2016.01)

(52) U.S. Cl.
CPC .......... *H03M 7/24* (2013.01); *G06F 12/0802* (2013.01); *H03M 7/70* (2013.01); *G06F 2212/1016* (2013.01); *H03M 7/3053* (2013.01)

(58) Field of Classification Search
CPC ........ H03M 7/24; H03M 7/70; H03M 7/3053; H03M 7/30; G06F 12/0802; G06F 2212/1016; G06F 12/08
USPC ..................................................... 341/50, 51
See application file for complete search history.

(56) References Cited

U.S. PATENT DOCUMENTS

| | | | | |
|---|---|---|---|---|
| 8,208,532 B2* | 6/2012 | Ekman | ................ | H04N 19/176 375/240 |
| 9,851,945 B2* | 12/2017 | Duong | .................... | G06F 7/483 |
| 2005/0071151 A1* | 3/2005 | Adl-Tabatabai | ........ | H03M 7/30 704/10 |
| 2009/0245382 A1* | 10/2009 | Ekman | ................ | H04N 19/176 375/240.24 |
| 2013/0007076 A1* | 1/2013 | Wegener | ................ | G06F 7/483 708/203 |
| 2017/0285960 A1 | 10/2017 | Yap et al. | | |

* cited by examiner

OTHER PUBLICATIONS

Wilson, Paul R., et al., "The Case for Compressed Caching in Virtual Memory Systems", Proceedings of the USENIX Annual Technical Conference, Monterey, California, Jun. 6-11, 1999, 33 pages.

*Primary Examiner* — Jean B Jeanglaude
(74) *Attorney, Agent, or Firm* — Alliance IP, LLC

(57) ABSTRACT

A processor comprises a first memory to store data elements that are encoded according to a floating point format including a sign field, an exponent field, and a significand field; and a compression engine comprising circuitry, the compression engine to generate a compressed data block that is to include a tag type per data element, wherein responsive to a determination that a first data element includes a value in its exponent field that does not match a value of any entry in a dictionary, a first tag type and an uncompressed value of the data element are included in the compressed data block; and responsive to a determination that a second data element includes a value in its exponent field that matches a value of a first entry in the dictionary, a second tag type and a compressed value of the data element are included in the compressed data block.

20 Claims, 16 Drawing Sheets

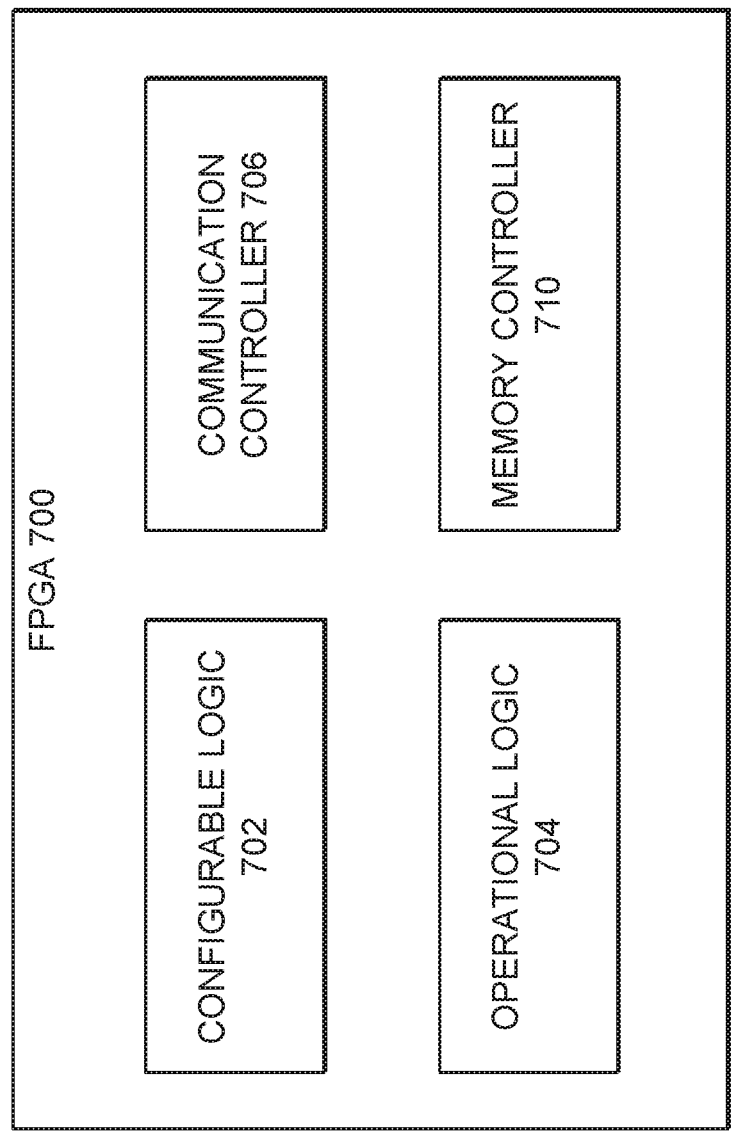

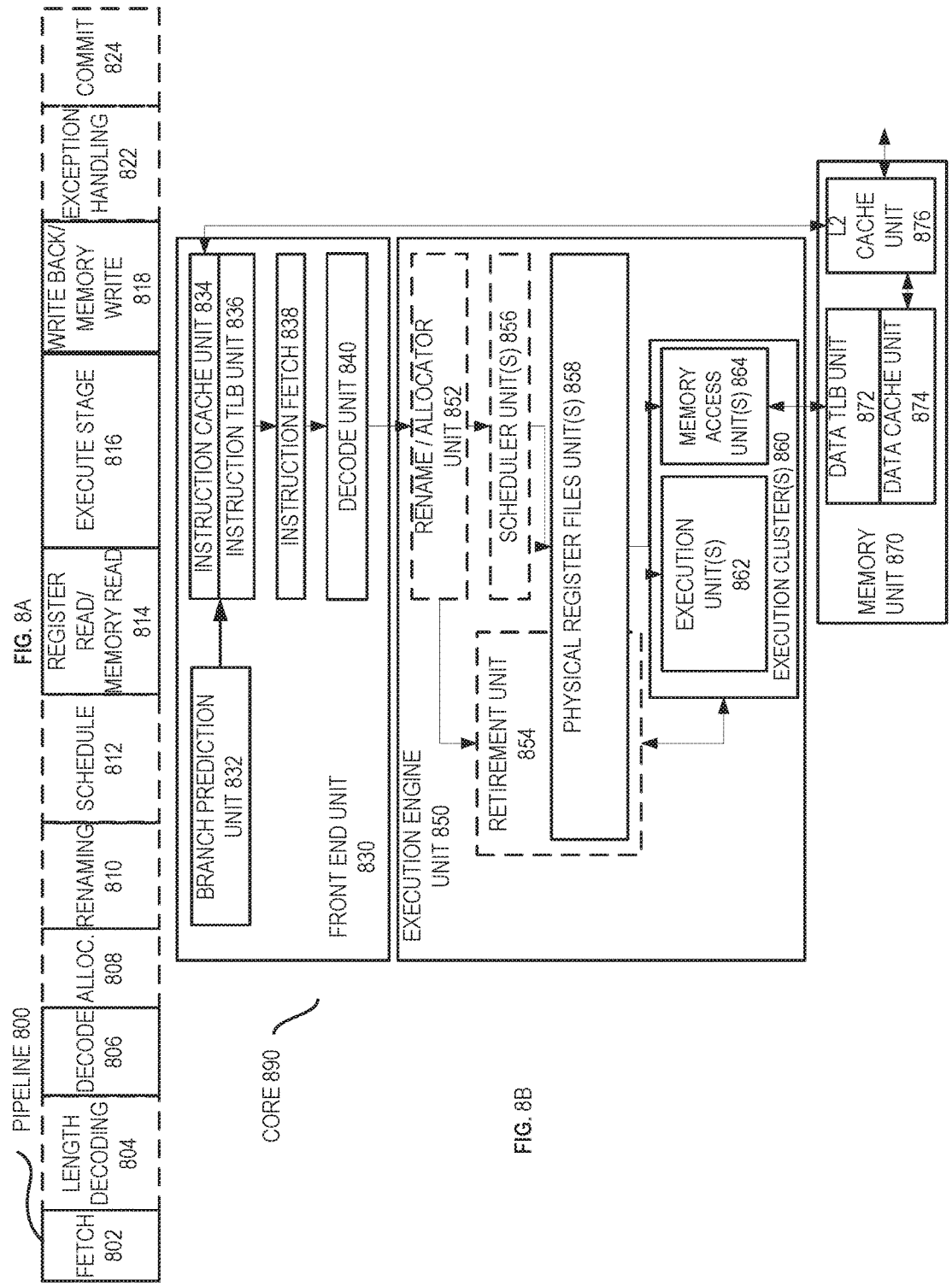

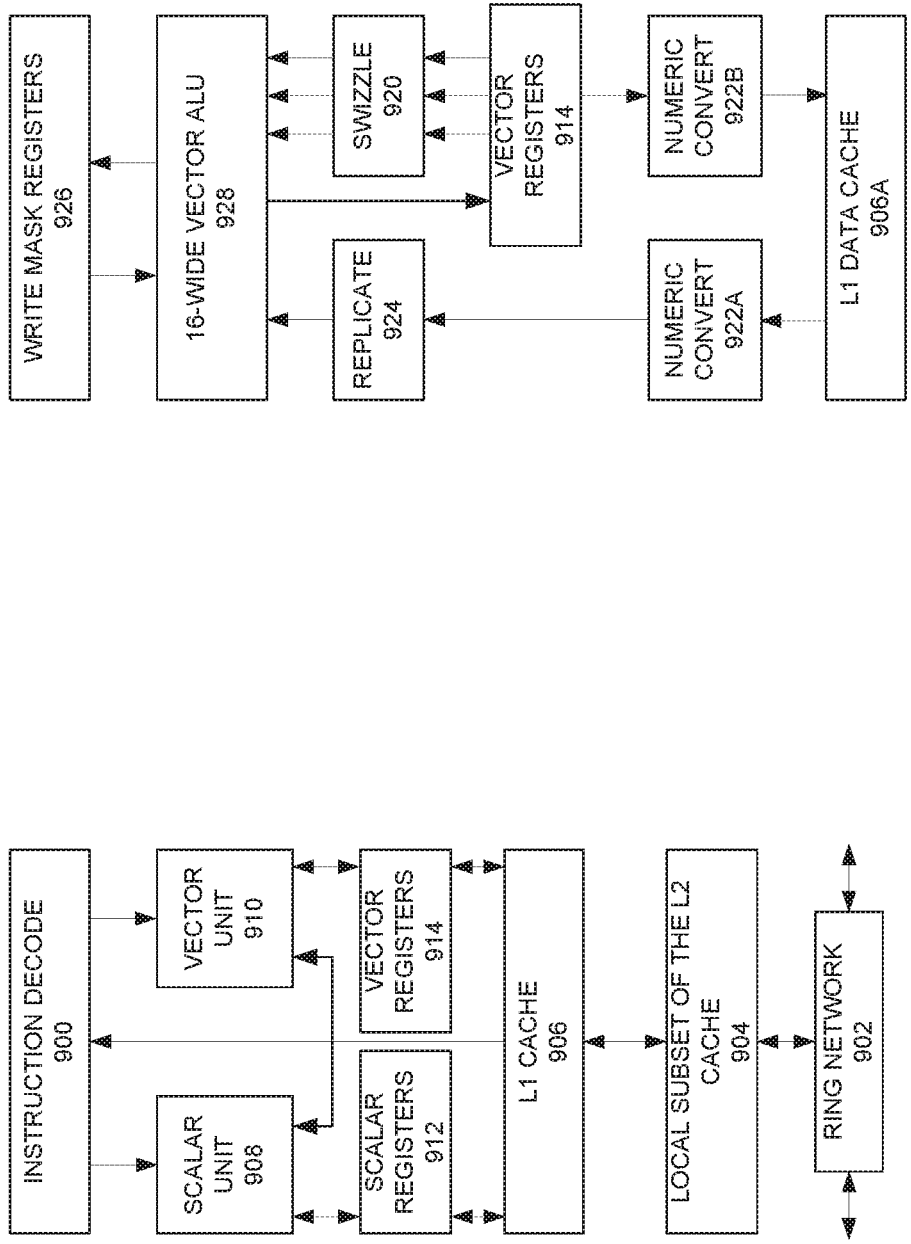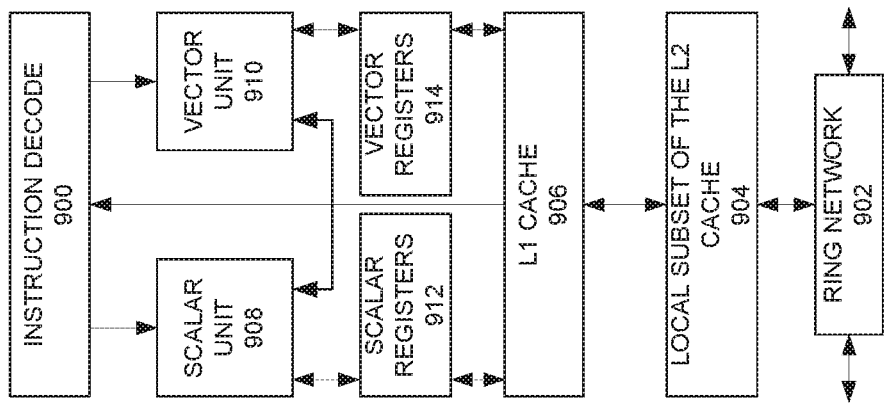

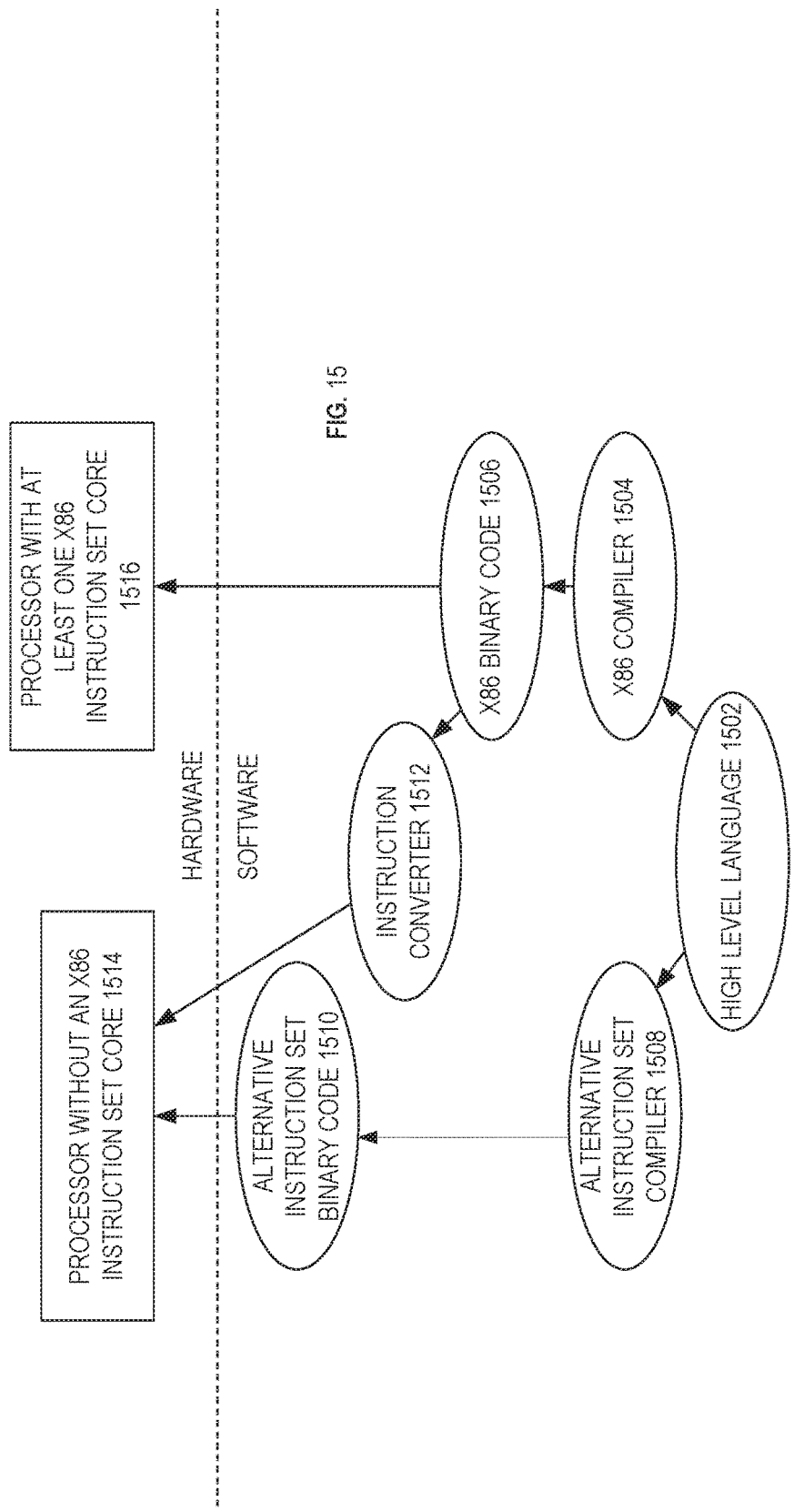

SYSTEM FOR COMPRESSING FLOATING POINT DATA

FIELD

The present disclosure relates in general to the field of computer development, and more specifically, to data compression.

BACKGROUND

A computing system may include one or more processors, one or more memories, and/or one or more memory controllers, among other components. Logic of the computing system may be operable to compress data elements.

BRIEF DESCRIPTION OF THE DRAWINGS

FIG. 7 illustrates an example field-programmable gate array (FPGA) in accordance with certain embodiments.

FIG. 8A is a block diagram illustrating both an exemplary in-order pipeline and an exemplary register renaming, out-of-order issue/execution pipeline in accordance with certain embodiments.

FIG. 8B is a block diagram illustrating both an exemplary embodiment of an in-order architecture core and an exemplary register renaming, out-of-order issue/execution architecture core to be included in a processor in accordance with certain embodiments;

FIGS. 9A-B illustrate block diagrams of a more specific exemplary in-order core architecture, which core would be one of several logic blocks (potentially including other cores of the same type and/or different types) in a chip in accordance with certain embodiments;

FIG. 15 is a block diagram contrasting the use of a software instruction converter to convert binary instructions in a source instruction set to binary instructions in a target instruction set in accordance with certain embodiments.

Like reference numbers and designations in the various drawings indicate like elements.

DETAILED DESCRIPTION

In various computer architectures, memory bandwidth consumption has become a challenge to performance gains. Constraints on memory bandwidth may be partially alleviated by compressing data prior to storing the data in a memory. Conventional compression schemes (e.g., WKdm) may work well for compressing data elements that are integer data types, indexes, or pointers where just a few least significant bits (LSBs) in the data elements differ (and a significant portion of the data elements remain static over a small region of locality), but provide little to no compressibility of floating point data, where the bits for the significand (also referred to as the mantissa or coefficient) may vary significantly across data elements. Thus, general purpose data compressions schemes may not be effective for compressing particular types of data sets, such as data sets (e.g., including instructions, activations, or weights) used in machine learning which may comprise data stored in a floating-point format, such as half-precision floating-point format (FP16). In the absence of a specialized compression scheme, the performance of a system may be limited by the memory bandwidth, even in architectures utilizing high bandwidth memory (HBM).

Figure 2A:
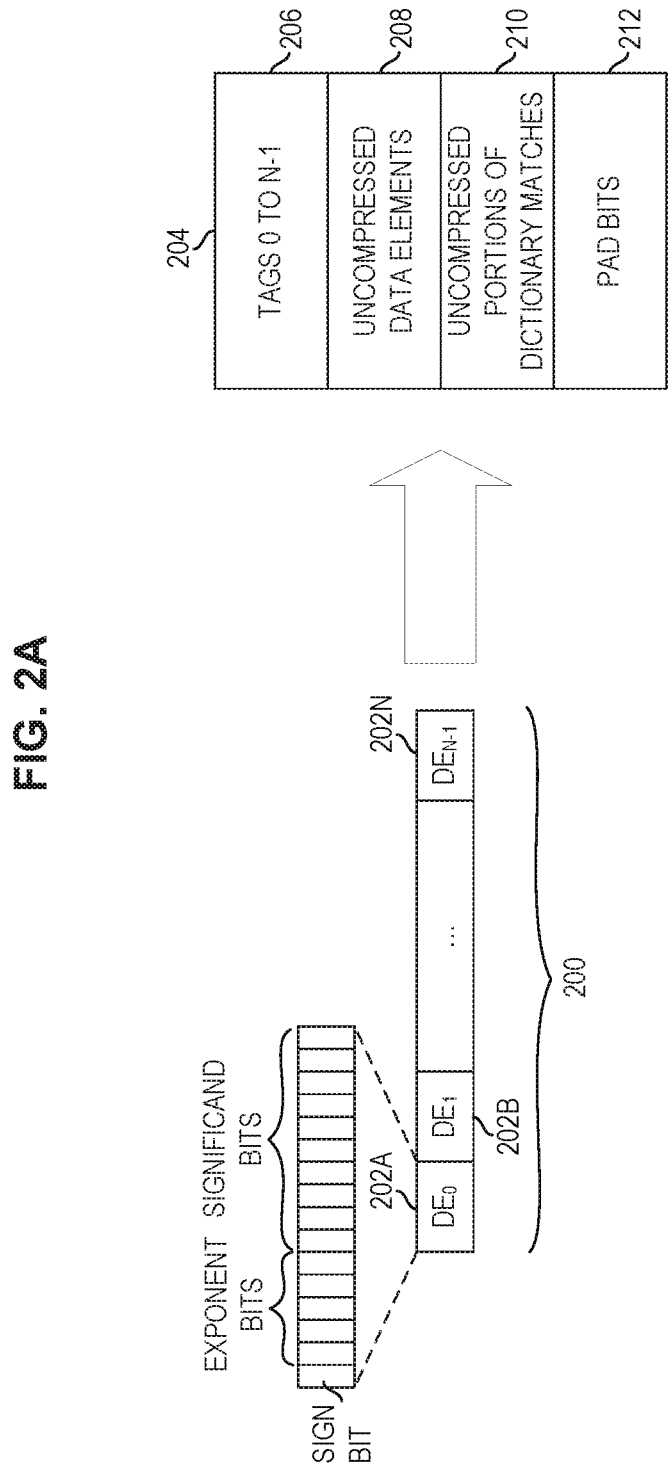
FIG. 2A illustrates compression of a data block comprising a plurality of data elements formatted according to half-precision floating-point format (FP16) in accordance with certain embodiments.

Various embodiments of the present disclosure provide systems and methods for compression of floating point data types used in machine learning or other applications as well as an efficient hardware design that improves utilization of the memory bandwidth and improves performance and power consumption. A particular embodiment includes hardware for compressing FP16 formatted data, although the disclosure described herein may be adapted to compress data that conforms to other floating-point formats having significand and exponent bits (such as single-precision floating-point (FP32), double-precision floating-point (FP64), etc.). Various embodiments of the present disclosure may improve compressibility of floating point data by compressing zeros, small constants (e.g. +/−1), a small clustered range of exponents, and/or the sign bit for specific data sets. Particular embodiments omit compression of the significand bits, due to their high variability. An example compression scheme is illustrated in FIG. 2A.

Technical advantages of various embodiments may include one or more of very high throughput for compression and decompression (e.g., 32 bytes per cycle), operation on small data block sizes (e.g., 64 bytes), low design complexity, reasonable read latency impact (e.g., less than 4 cycles), reasonable area impact (e.g., less than 200,000 logic gates), and a reasonable power footprint. In various embodiments, minimal latency is added to the read/write paths, while an increase in effective bandwidth of about 10-50% is provided for typical machine learning data sets in FP16 format. Various embodiments may provide a compression engine 108 that operates on small blocks (e.g. 16 bytes, 32 bytes, 64 bytes, etc.) that are sized based on the data-path to memory as opposed to larger blocks such as pages (e.g., 1 KB, 2 KB, 4 KB, etc.). The methods and systems described herein may provide improved performance across a wide range of block sizes.

Figure 1:
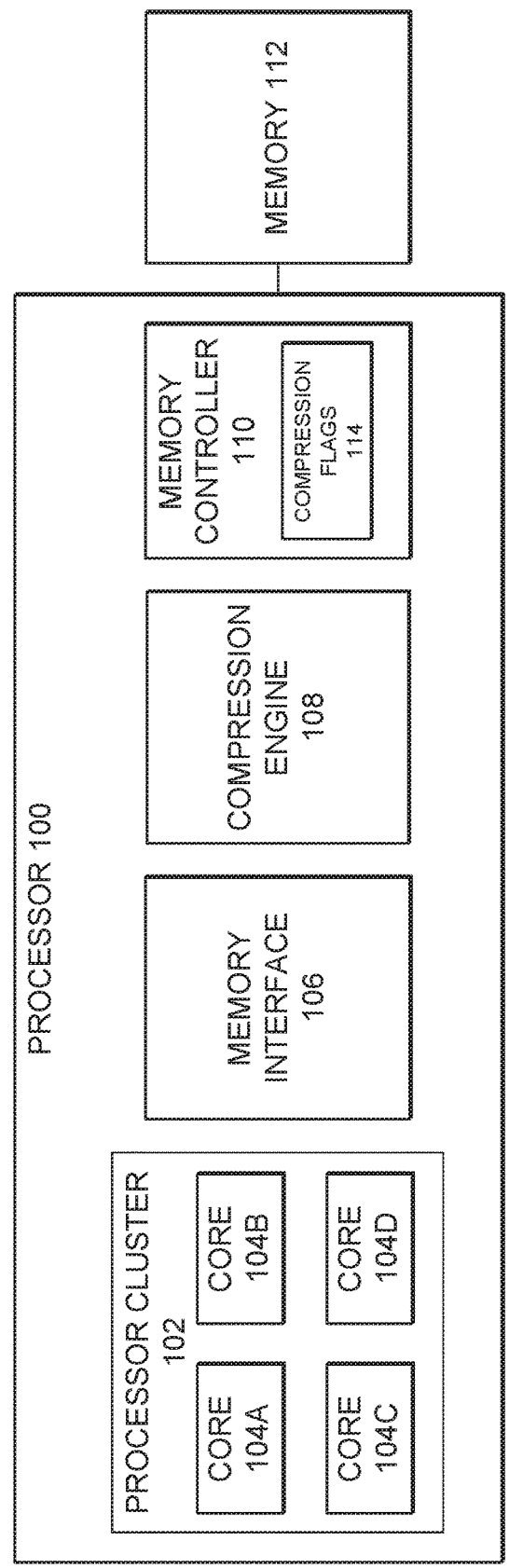
FIG. 1 illustrates a block diagram of a processor to compress floating point data in accordance with certain embodiments.

FIG. 1 illustrates a block diagram of a processor 100 to compress floating point data in accordance with certain embodiments. Processor 100 includes a processor cluster 102 comprising a plurality of cores 104, a memory interface 106, a compression engine 108, and a memory controller 110. Processor 100 is coupled to memory 112.

Processor 100 may comprise a microprocessor, an embedded processor, a digital signal processor (DSP), a network processor, a handheld processor, an application processor, a coprocessor, a system on a chip (SOC), or other device to execute code (i.e., software instructions). Processor 100, in the depicted embodiment, includes four processing elements (cores 102A-102D) arranged in a processor cluster 102. The processor 100 may include asymmetric processing elements or symmetric processing elements. However, a processor may include any number of processing elements that may be symmetric or asymmetric.

In one embodiment, a processing element refers to circuitry to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core 104 (e.g., 104A-104D) may refer to logic located on an integrated circuit capable of maintaining an independent architectural state, wherein each independently maintained architectural state is associated with at least some dedicated execution resources. A hardware thread may refer to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

In various embodiments, the processing elements may also include one or more arithmetic logic units (ALUs), floating point units (FPUs), caches, instruction pipelines, interrupt handling hardware, registers, or other hardware to facilitate the operations of the processing elements.

Cores 104 or other processing elements may send memory requests (e.g., read, write, read-modify-writes (byte write enable), copy, copy with byte enable, scatter write/copy, or other requests) to memory interface 106. In some instances, the requests may reference data of any suitable size. For example, the request may ask for one or more cache lines of data. In some embodiments, the request may ask for a page (e.g., 1 KB, 2 KB, 4 KB, etc. of data) comprising a large number of cache lines. Memory interface 106 may unroll the request and generate multiple smaller requests to be sent to memory controller 110. For example, memory interface 106 may break up a larger request into a series of read or write requests that each reference a single cache line (e.g., 64 bytes).

Compression engine 108 comprises circuitry operable to compress data to be written to the memory 112. For example, a processing element of the processor 100 may issue a write request and the memory interface 106 may provide the data to be written to the compression engine 108 in one or more data blocks (e.g., cache lines or other data grouping). Compression engine 108 may compress each block of the data to be written according to any of the embodiments described herein. The compressed data block(s) may then be provided to the memory controller 110 for communication to the memory 112.

Compression engine 108 may also be operable to decompress data that is read from memory 112. Memory controller 110 may read data from memory 112 and provide the read data to compression engine 108. Compression engine 108 may decompress the data and provide the decompressed data to the processing element that requested the read (e.g., through the memory interface 106).

In various embodiments, compression engine 108 may be located on the same chip as one or more cores 104, memory controller 110, and/or memory 112 (which may be located on the same chip as cores 104 or a different chip) or may be located on a different chip from any one or more of cores 104, memory controller 110, and/or memory 112. In a particular embodiment, compression engine 108 may be collocated with memory controller 110, memory interface 106, a core 104 (or may be a component of either of these).

Memory controller 110 includes circuitry to control the flow of data going to and from one or more memories 112. Memory controller 110 may include logic operable to read from a memory 112, write to memory 112, or to request other operations from memory 112. During operation, memory controller 110 may issue commands including one or more addresses in order to read data from or write data to memory 112 (or to perform other operations).

In the embodiment depicted, memory controller 110 stores compression flags 114. The compression flags indicate which data was compressed by compression engine 108 before storage in the memory 112. For example, a compression flag may correspond to a particular address of a cache line and may provide a binary indication of whether the cache line data was compressed or not. The compression flags may take any other suitable form that allows the memory controller 110 to determine whether data associated with a particular address was compressed before being written to the memory 112. When data at a particular address is to be read, the memory controller may access the corresponding compression flag to determine how the compressed data should be read (e.g., an uncompressed data block may be read differently from a compressed data block). In a particular embodiment, a compression flag may indicate whether at least a 50% compression ratio was achieved for a particular data block to allow the memory controller 110 to read one half of the data that would normally be read when retrieving an uncompressed data block. In an alternative embodiment, compression flags 114 may be stored by the compression engine 108 and when read requests are received the compression engine 108 may determine based on compression flags whether the requested data was compressed and may send appropriate requests to the memory controller based on the compression flags. For example, compression engine 108 may receive a read request for a particular cache line which would normally require a read over two channels (if the cache line was not compressed) and may submit a request to read the compressed cache line over a single channel to the memory controller.

In various embodiments, memory 112 may comprise any number of memory arrays to store data. Memory 112 may comprise any non-volatile memory and/or volatile memory. Memory 112 may comprise any suitable type of memory and is not limited to a particular speed, technology, or form factor of memory in various embodiments. As one example, memory 112 may be a memory module (e.g., a dual in-line memory module (DIMM), a single in-line memory module (SIMM), etc.) that may be inserted in a socket. In a particular embodiment, memory 112 has a DIMM form factor. A DIMM may include multiple memory chips mounted on a circuit board, wherein the circuit board includes electrical contacts (i.e., pins) on each side of the circuit board. In various examples, the memory 112 may have any suitable number of pins, such as 288, 260, 244, 240, 204, 200, or other suitable number of pins. In various embodiments, memory 112 may be inserted into a DIMM slot on circuit board (e.g., a motherboard) that also comprises a socket for processor 100. In a particular embodiment, memory 112 is a non-volatile DIMM (NV-DIMM) comprising memory chips that include non-volatile memory. In another embodiment, memory 112 is a DIMM comprising memory chips that include volatile memory (e.g., dynamic random access memory (DRAM)). In another embodiment, memory 112 may be located on the same chip as processor 100. For example, the memory 112 may be a last level or other cache.

In a particular embodiment, memory 112 includes a plurality of banks that may be used to write data independently of each other (with each bank being coupled to a respective channel between the memory 112 and the memory controller 110). In one embodiment, the number of banks used to write an uncompressed block is larger than the number of banks used to write a compressed block. For example, the memory 112 may include two banks which are both used to write an uncompressed block to the memory 112, but a single bank may be used to write a compressed block to the memory 112 (assuming that a 50% compression ratio was achieved on the block).

FIG. 2A illustrates compression of a data block comprising a plurality of data elements formatted according to half-precision floating-point format (FP16) in accordance with certain embodiments. Each uncompressed data element 202 conforms to the Institute of Electrical and Electronics Engineers (IEEE) 754 standard which specifies the FP16 format. Accordingly, a data element 202 includes (moving from the MSB on the left of the embodiment depicted to the LSB on the right of the embodiment depicted) a sign bit, a 5-bit exponent, and a 10-bit significand (which may specify an 11-bit significand having an implicit lead bit with value 1). The exponent has a bias of 15, and regular numbers are defined as $(-1)^{signbit} \times 2^{exponent-15} \times 1 \cdot significandbits_2$. The exponents 00000 and 11111 are interpreted specially. When the exponent is 00000 and the significand is 0000000000, the number represented is 0 (if the significand is any other value when the exponent is 00000, the number represented is considered subnormal and is determined as $(-1)^{signbit} \times 2^{-14} \times 0 \cdot significandbits_2$). When the exponent is 11111 and the significand is 0000000000, the number represented is ±infinity (if the significand is any other value, the number represented is considered as not-a-number (NaN)).

The data elements 202 (i.e., 202A-202N) of the data block 200 are processed together to generate a compressed block 204. In a particular embodiment, the size of the data block 200 (as defined by the number of data elements "N" in the data block 200) may match the size of a bus (which may comprise one or more channels) to the memory 112, correspond to the memory bus rate, or may otherwise be based on the hardware implementation. For example, to achieve 16 bytes per cycle (i.e., the compression engine 108 receives 16 uncompressed bytes per cycle for a read and outputs 16 decompressed bytes per cycle for a write) using a 16-bit data element size (in accordance with FP16), N is set to 8. As another example, to achieve 32 bytes per cycle using a 16-bit data element size, N is set to 16. In various embodiments, the size of data block 200 matches the size of a cache line of memory 112 (e.g., 64 bytes) or is one half of the size (e.g., 32 bytes) of the cache line.

Each data block 200 is encoded independently of other blocks (although, as explained in greater detail below, a dictionary may be maintained across blocks and thus the compression of a data block may depend on the dictionary generated using one or more previous blocks). In the embodiment depicted, compressed block 204 includes tags 206, uncompressed data elements 208, uncompressed portions of dictionary matches (i.e., portions of data elements having exponents matching dictionary entries) 210, and pad bits 212. While each compressed block 204 includes tags 206, depending on the contents of the uncompressed data block 200, one or more of uncompressed data elements 208, uncompressed portions of dictionary matches 210, or pad bits 212 may be omitted from a compressed block 204.

In particular workloads, the range of the exponent values may be relatively small (e.g., −1, 0, or +1) such that compression may be achieved by encoding commonly used exponents using tags. The compression engine 108 processes each data element 202 of the block 200 and determines a tag for each data element. A first tag value indicates a value of 0 for the data element (i.e., the exponent bits and the significand bits are all 0). A second tag value indicates that the exponent bits of the data element did not match an entry in a dictionary of exponent values. In a particular embodiment (e.g., when FP16 data is being compressed), compression engine 108 may utilize a dictionary that includes 5-bit exponent values (though in other embodiments any suitable length of exponents, such as 8-bits or 11-bits, may be stored in the dictionary). The compression engine may determine whether the exponent bits of the data element 202 being processed match an entry in the dictionary. If the exponent bits do not match any entry in the dictionary, then the aforementioned second tag value is used for the data element to signify that the data element was not able to be compressed. If the exponent bits match an entry of the dictionary, a tag value corresponding to the particular entry of the dictionary that was matched is included in tags 206 for the data element. For example, when a dictionary stores two 5-bit exponent entries, a third tag value and a fourth tag value may be used respectively that the first entry or the second entry of the dictionary matched the exponent bits of the data element being processed. Thus, in some embodiments, each tag value may be two bits in length to provide for the four tag values described above. As another example, a dictionary may include six 5-bit exponent entries and each tag value may be three bits in length to provide for the first two tag values described above (i.e., corresponding to a 0 value or no match) and six additional tag values to each correspond to a respective entry of the dictionary that is matched by the exponent value of the data element 202 being processed.

In a particular embodiment, the tags may be stored together in series within compressed block 204. In the embodiment depicted, the tags 206 are followed by uncompressed data elements 208 of the block 200 (i.e., the data elements that were not 0-valued and did not have exponent bits matching a dictionary value). Following the uncompressed data elements 208, the compressed block 204 includes uncompressed portions (i.e., the sign bit and the significand bits) of data elements that included exponent bits matching dictionary values (with the exponent bits of such a data element being compressed into the tag value for the data element). In another embodiment, the order of the uncompressed portions 210 and the uncompressed data elements 208 may be swapped. In various embodiments, the compressed block 204 may be padded with bits 212 such that the total number of bits of compressed block 204 is a multiple of 8 or 16 to simplify decompression (e.g., to make it easier for the compression engine 108 to distinguish between compressed blocks during decompression, thus allowing the compression engine to operate at a higher frequency).

Figure 2B:
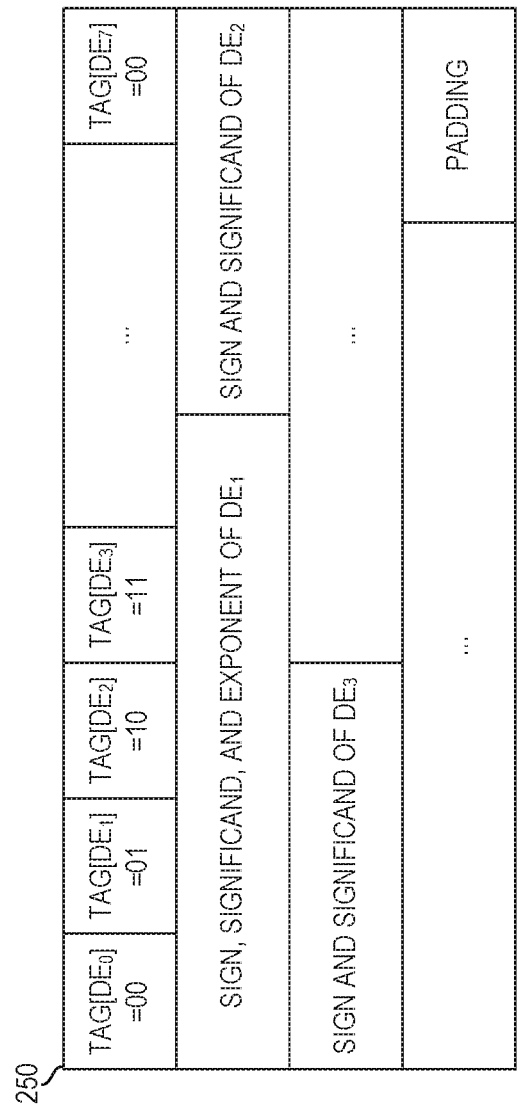
FIG. 2B illustrates an example compressed data block in accordance with certain embodiments.

FIG. 2B illustrates an example compressed data block 250 in accordance with certain embodiments. Data block 250 may have any suitable characteristics of compressed data block 204. In the embodiment depicted, compressed data block 250 includes a tag value for each data element. The tag value for data element 0 is 00, the tag value for data element 1 is 01, the tag value for data element 2 is 10, and the tag value for data element 3 is 11, the tag values for data element 4 through 6 are not shown, and the tag value for data element 7 is 00. In the embodiment depicted, tag value 00 corresponds to a 0 value, thus the only the tag for data element 0 is stored in the compressed block 250. Similarly, only the tag for data element 7 is stored in the compressed block 250. In the embodiment depicted, tag value 01 corresponds to a data element not having a match in the dictionary, accordingly the compressed data block 250 includes the entirety of data element 1 (including the sign, significand, and exponent of data element 1). In the embodiment depicted, tag value 10 corresponds to a data element having an exponent matching a first entry in the dictionary and tag value 11 corresponds to a data element having an exponent matching a second entry in the dictionary. Accordingly, for data elements 2 and 3, the sign and significand bits of data element 2 and data element 3 are stored in the compressed block 250. The corresponding compressed or uncompressed portions of data elements 4 through 6 are not depicted. The compressed data block 250 also includes padding to achieve a desired length of the compressed data block 250 (e.g., along a byte boundary).

In some embodiments, the dictionary may include a plurality of entries that each include a combination of a sign bit and an exponent. In such an embodiment, when a sign bit and exponent of a data element match an entry of the dictionary, a tag may be assigned to the data element and the tag value and the significand (but not the exponent nor the sign bit) is written to the compressed data block (since the tag value in combination with the dictionary is able to encode the sign bit as well as the exponent.

In a 2-bit tag implementation operating on data elements having lengths of 16 bits, each data element having a value of 0 is compressed into a 2-bit tag, each data element that does not match against a dictionary entry is uncompressed and the entire 16 bits is written into block 204, and each data element that does match against a dictionary entry is partially compressed (i.e., the 5-bit exponent is compressed to a 2-bit tag and the sign bit and 10-bit significand are not compressed). Thus, if the number of matches is M and the number of non-0 valued, non-matching data elements is F, the total bit-count for the compressed block is 32+F*16+M*11.

In a 3-bit tag implementation operating on data elements having lengths of 16 bits, each data element having a value of 0 is compressed into a 3-bit tag, each data element that does not match against a dictionary entry is uncompressed and the entire 16 bits is written into block 204, and each data element that does match against a dictionary entry is partially compressed (i.e., the 5-bit exponent is compressed to a 3-bit tag and the sign bit and 10-bit significand are not compressed). Thus, if the number of matches is M and the number of non-0 valued, non-matching data elements is F, the total bit-count for the compressed block is 48+F*16+M*11.

One advantage of this scheme is that no separate field is needed for the offset or positions of matching bits since that information is directly encoded into the tag information (i.e., since each matching tag value corresponds to a separate position of the dictionary).

Figure 3:
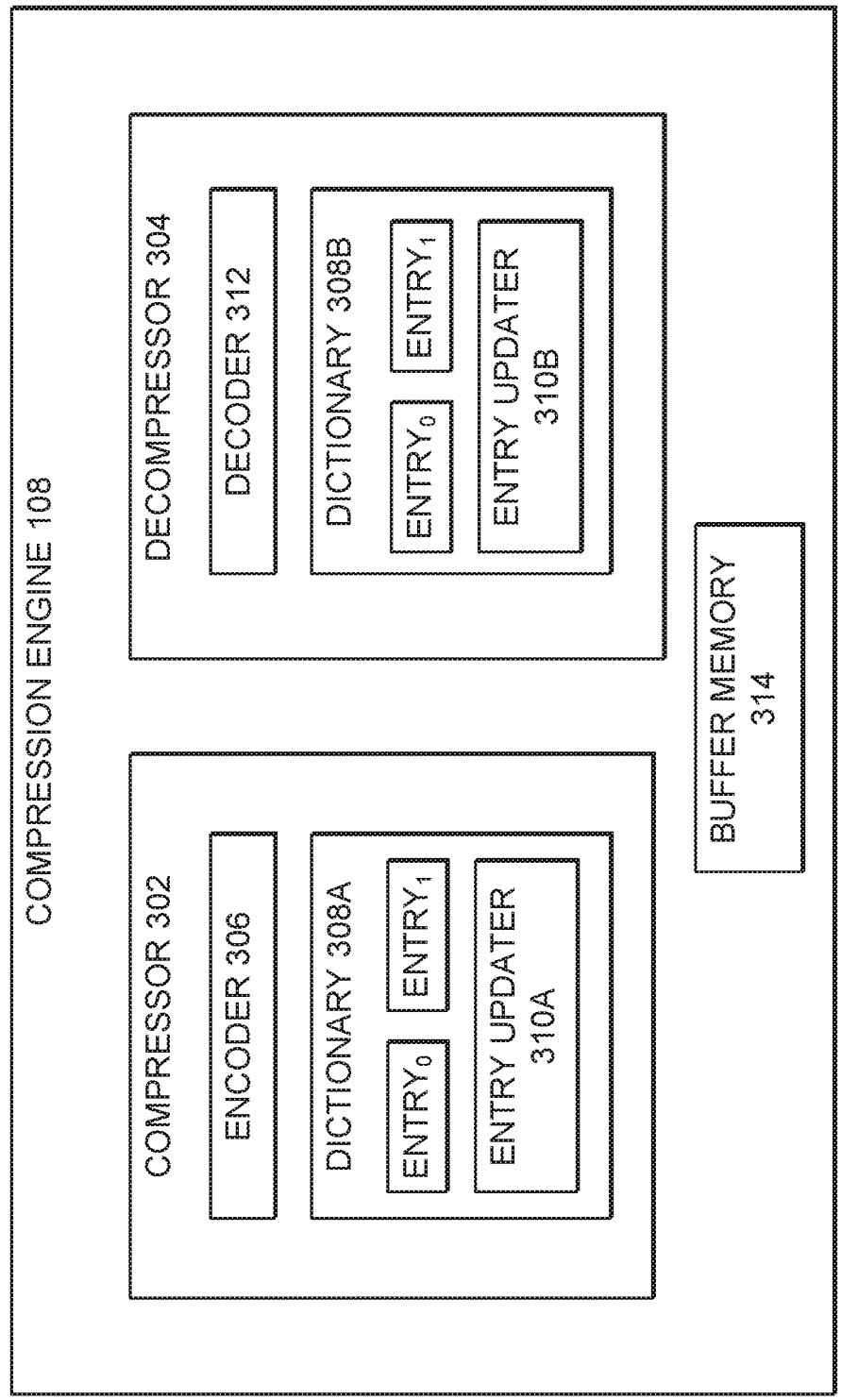
FIG. 3 illustrates a compression engine of the processor of FIG. 1 in accordance with certain embodiments.

FIG. 3 illustrates a compression engine 108 of the processor of FIG. 1 in accordance with certain embodiments. Compression engine 108 includes compressor 302, decompressor 304, and buffer memory 314. Compressor 302 includes encoder 306 and dictionary 308A. Encoder 306 is operable to form the compressed block 204 by determining a tag for each data element 202 of a block 200 by checking for zero values and matches with entries of dictionary 308A and then generating the compressed block 204 with the tags 206, uncompressed data elements 208, uncompressed portions of dictionary matches 210, and pad bits 212 as applicable. Buffer memory 314 may comprise any suitable memory to store data, such as an uncompressed data block 200 and/or compressed data block 204 and may be used during compression and/or decompression.

In the embodiment depicted, the dictionary 308A includes two entries: $entry_0$ and $entry_1$, although in other embodiments the dictionary 308A may include any suitable number of entries (e.g., six entries when the tags are three bits long). When the format of the data being compressed is FP16, the entries of the dictionary 308A may each store a 5-bit exponent value (for other floating point formats, the dictionary may store entries with exponents matching the length of the exponents in the data elements). For each data element 202 of the uncompressed block 200, the exponent bits (i.e., bits 14:10) of the data element may be examined to determine whether they match corresponding bits of an entry of the dictionary. In a particular embodiment, one or more bits of the exponent of a data element to be compressed is used to index into the dictionary to select the entry of the dictionary to compare against the exponent bits of the data element. For example, with a two-entry dictionary, a single bit of the exponent of the data element may be used to index into the dictionary (i.e., if the bit value is 0, $entry_0$ is compared against the exponent bits of the data element and if the bit value is 1, $entry_1$ is compared against the exponent bits of the data element). In one embodiment, the LSB of the exponent of the data element is used to index into the dictionary to select the dictionary entry for comparison.

In another embodiment, a hash operation may be performed on multiple bits of the data element's exponent to calculate an index of dictionary. Any suitable hash operation may be used. As one example, to index into a dictionary 308A having six entries, a modulo six operation may be performed on the three LSB's of the data element's exponent to determine the entry of the dictionary to compare against the exponent of the data element. In a particular embodiment, dictionary 308A and/or 308B may be stored in a content addressable memory (CAM) allowing parallel searches.

The dictionary entries may be initialized by entry updater 310A with any suitable values prior to the beginning of compression of a new data series (where a data series may include a plurality of uncompressed blocks 200). In some embodiments, the dictionary entries are initialized based on static values that do not change during operation of the processor 100. As an example, in an embodiment utilizing a two-entry dictionary, the entries may be initialized to +1 and −1 each time a new data series begins compression. In some embodiments, the initialization may be application specific. For example, for a first type of workload (e.g., for the storage of activation data in a machine learning workload), the entries of the dictionary 308A may be initialized with a first set of values, and for a second type of workload (e.g., for the storage of synapse weights in a machine learning workload), the entries of the dictionary 308A may be initialized with a second set of values (where at least one value of the second set is different from a corresponding value of the first set). Thus, the entries may be initialized to values that are most likely to match exponents of data elements processed for a particular type of workload. Initialization of the dictionary entries with application-specific values may improve the compression ratio, especially for data series with relatively few uncompressed data blocks (e.g., 2, 4, 8, etc.), since in such cases the dictionary 308A does not have sufficient time to be primed with commonly occurring exponents of the data series (the updating of the dictionary 308A is described below in more detail). Compression schemes using larger dictionaries may benefit more from optimal initialization than smaller dictionaries.

In another embodiment, the values used for initialization of the dictionary 308A are updated during operation of the processor 100 based on the incidence rate of the exponents. For example, compression engine 108 may include a performance monitor that updates a histogram of the counts for the various exponents across multiple data series. When an initialization is performed, the most frequently occurring exponents may be used to initialize the entries of the dictionary. In various embodiments, the histogram may be periodically reset to ensure that the most frequently occurring exponents over the most recent time interval are used for the initialization. In some embodiments, a separate histogram may be kept for each of a plurality of different types of workloads and the entries of the dictionary 308A may be initialized based on the histogram corresponding to the workload associated with the data series to be compressed.

The dictionary 308A may be updated by entry updater 310A as the data blocks 200 of the data series are processed by the compression engine 108. Various conventional compression schemes are defined such that a dictionary update happens after each data element, but this complicates the design if all of the data elements are to be compressed in parallel, since the update logic has to check every data element in every lane in flight to find the most current values for the dictionary entries. In a particular embodiment of the present disclosure, the entries of dictionary 308A are updated based on the current block 200 for the next block 200 of the data series (thus the dictionary used for a particular block may be based on the contents of the previous block). Such an embodiment avoids serial dependency among data elements of the block and allows any number of the data elements (e.g., all of the data elements) to be compressed in parallel by compressor 302 (e.g., the tag determinations for each data element may be performed simultaneously by encoder 306).

In a particular embodiment comprising a two-entry dictionary, each of the two entries of the dictionary may take the value of the last possible exponent (i.e., the exponent of the data element 202 having the highest index within data block 200) with the corresponding LSB. For example, in a data block 200 having sixteen data elements 202 to be compressed and exponent bits of 10101 for data element 12 ($DE_{12}$), 10001 for $DE_{13}$, 10100 for $DE_{14}$, and 10000 for $DE_{15}$, the first entry (corresponding to an LSB of 0) of the dictionary would be updated to 10000 and the second entry (corresponding to an LSB of 1) of the dictionary would be updated to 10001. Thus, the most recent exponent having a matching LSB is used to update the corresponding entry of the dictionary 308A. In other embodiments, the lowest indices in the data block 200 with data elements having exponents matching the corresponding LSBs may be used for the update instead of the highest indices.

In various embodiments, the dictionary updating operation ignores 0-valued data elements (i.e., data elements in which the exponent and significand bits are all 0), thus $entry_0$ is not updated to "00000" based on one or more zero-valued data elements (but may be updated to "00000" based on one or more data elements having exponent bits that are all 0 and at least one significand bit that is not 0). If there are no data elements with exponents fitting the updating criteria for a particular entry, the entry remains unchanged. For example, if none of the data elements have an exponent with an LSB of 1, $entry_1$ remains unchanged. As another example, if none of the non-zero valued data elements have an exponent with an LSB of 0, $entry_0$ remains unchanged. Thus, for some data blocks 200, only a single entry of the dictionary 308A may be updated or neither entry is updated.

In other embodiments, the dictionary entries may be updated in any suitable manner. For example, the number of times each exponent occurs in the data elements 202 of the block 200 may be counted and for each dictionary entry, the most frequent exponent having the appropriate LSB may be used to update the entry (i.e., $entry_0$ may be updated with the most frequent exponent having an LSB of 0 and $entry_1$ may be updated with the most frequent exponent having an LSB of 1).

In various embodiments, the dictionary 308A is updated once per M blocks, where M is any suitable integer. This allows for even further parallelization of the compression hardware. In such embodiments, the dictionary 308A may be updated based on the contents of the last block 200 of the M blocks, one or more of the M blocks, or all of the M blocks plus additional previous blocks according to any of the updating schemes described above or other suitable updating schemes.

Decompressor 304 is operable to receive a compressed block 204 read from memory 112 and generate a corresponding uncompressed block 200 based on the contents thereof. Decoder 312 may read each tag of the compressed block 204 and generate a corresponding uncompressed data element 202 based on the tag and associated information (e.g., an uncompressed portion of a dictionary match or an uncompressed data element) if the tag indicates a match or an uncompressed data element. For tags indicating dictionary matches, decoder 312 may access an entry of dictionary 308B to obtain the exponent value for the data element. Entry updater 310B may initialize and update the entries of dictionary 308B in the same manner as entry updater 310A. In a particular embodiment, the data may be read in the same order in which it was written in order to ensure that the correct dictionary entries are used during the decoding. Any other suitable methods to update dictionary entries to use for a compressed block may be used.

Figure 4:
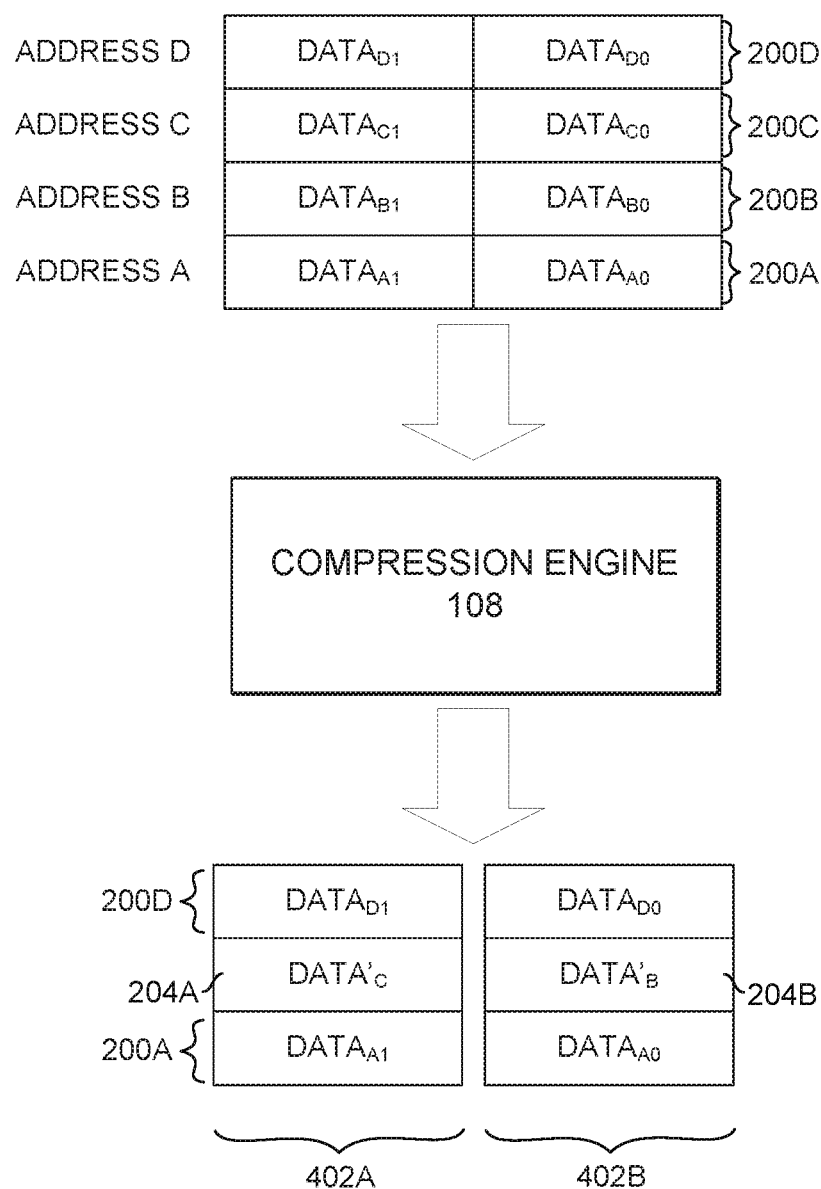
FIG. 4 illustrates compression and placement of write data onto two channels in accordance with certain embodiments.

FIG. 4 illustrates compression and placement of write data onto two channels 402 (i.e., 402A and 402B) in accordance with certain embodiments. The channels 402 may couple the memory controller 110 to the memory 112. In a particular embodiment, each channel may couple to a different bank of the memory 112. In various embodiments, a cache line architecture may be used by processor 100 wherein each data block 200 comprises a cache line (e.g., 32 bytes or 64 bytes).

Each data block 200 of the write data may be sent along with its address towards the memory 212 (e.g., by memory interface 106). Before being written to memory 212, each data block 200 may be processed by compression engine 108. In the embodiment depicted, the write data includes data block 200A associated with address A, data block 200B associated with address B, data block 200C associated with address C, data block 200D associated with address D. Data blocks 200 are shown having two equally sized portions. For example, data block 200A comprises a first portion $DATA_{A0}$ and a second portion $DATA_{A1}$. As an example, the first portion may include half of the data elements 202 of the block 200A while the second portion may include the other half of the data elements 202 of the block. If a block 200A is uncompressed by compression engine 108 (or a sufficient compression ratio is not realized), the data of the block 200A is sent using both channels 402A and 402B, with $DATA_{A1}$ sent across a first channel 402A and $DATA_{A0}$ sent across a second channel 402B (data block 200D is treated similarly). However, if a sufficient compression ratio (e.g., 50%) is achieved, a single channel may be used to send a compressed data block to memory 112 for storage therein. In the example depicted, both data block 200B and data block 200C were sufficiently compressed such that each resulting compressed data block (i.e., $DATA'_B$ and $DATA'_C$) is sent over a single channel (e.g., simultaneously). In some embodiments, a compressed block may be held for one or more cycles such that it may be sent on a channel at the same time that another compressed block is sent over another channel (such that uncompressed blocks may be sent using both channels in intervening cycles).

In various embodiments, a hashing operation may be performed by memory controller 110 on the address of a compressed block 204 to determine which channel 402 the block is to be transmitted on. Such embodiments may evenly distribute the compressed blocks 204 among channels 402 to promote higher throughput. The hashing operation may be repeated by the memory controller 110 at the time of the reading of the compressed block to ensure that the compressed block is read over the correct channel and from the correct bank of memory 112.

Figure 5:
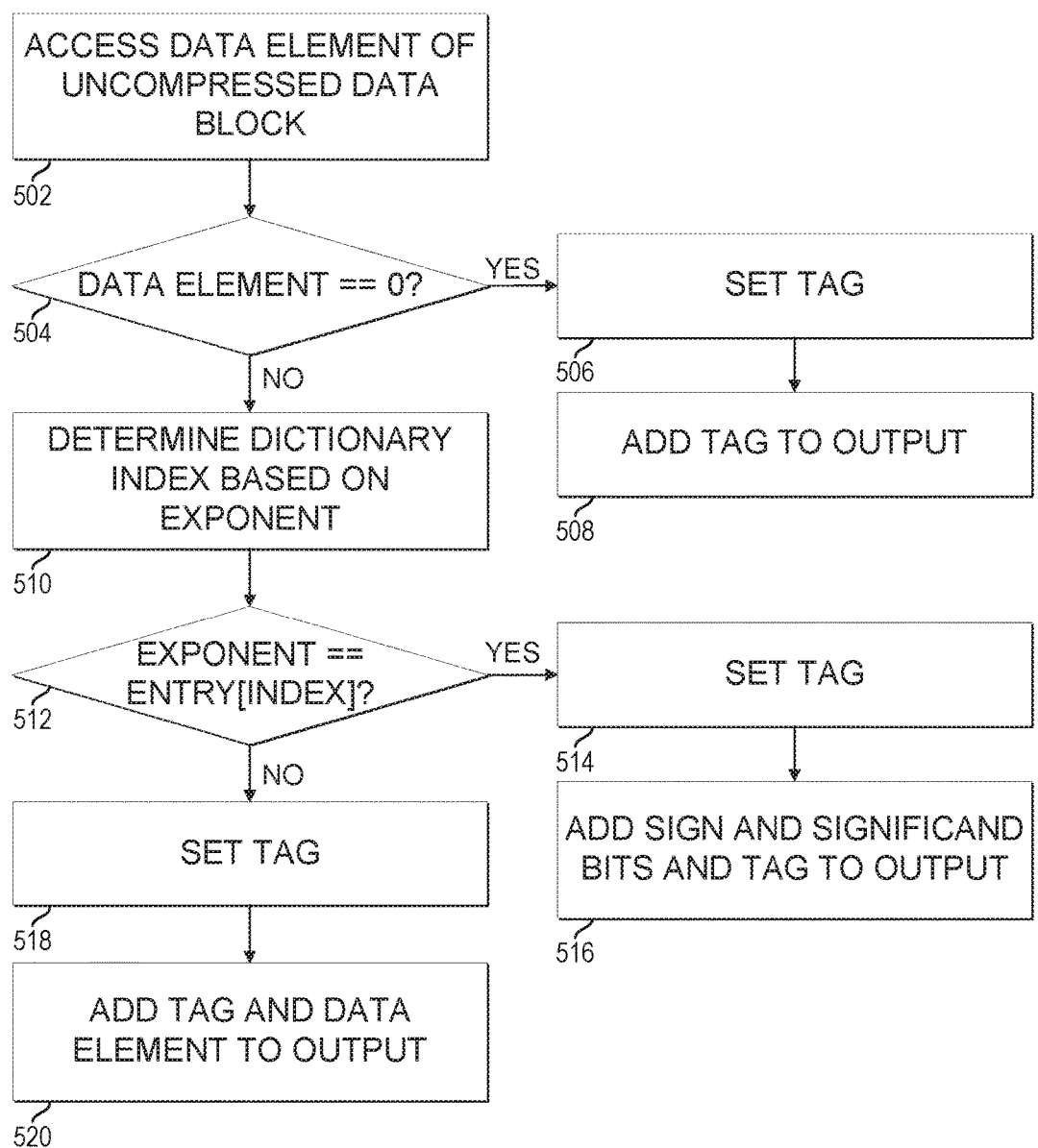
FIG. 5 illustrates a flow for compressing data in accordance with certain embodiments.

FIG. 5 illustrates a flow for compressing data in accordance with certain embodiments. In various embodiments, the flow may be performed by compression engine 108 and/or other suitable logic comprising circuitry.

At 502, a data element 202 of an uncompressed data block 200 is accessed. At 504, a determination is made as to whether the data element is zero-valued. If the data element is zero valued, a tag value corresponding to a zero-valued data element is set at 506 and the tag is added to an output at 508. If the data element is not zero-valued, a dictionary index is determined based on an exponent value of the data element at 510. At 512, a determination is made as to whether the entry of a dictionary corresponding to the index matches the exponent of the data element 202. If it does match, a tag value corresponding to the dictionary index is set at 514. At 516, this tag value along with a sign bit and significand bits of the data element are added to the output. If the entry of the dictionary corresponding to the index does not match the exponent of the data element 202, then a tag value indicating no match is set at 518. The tag and the data element 202 are added to the output at 520.

Figure 6:
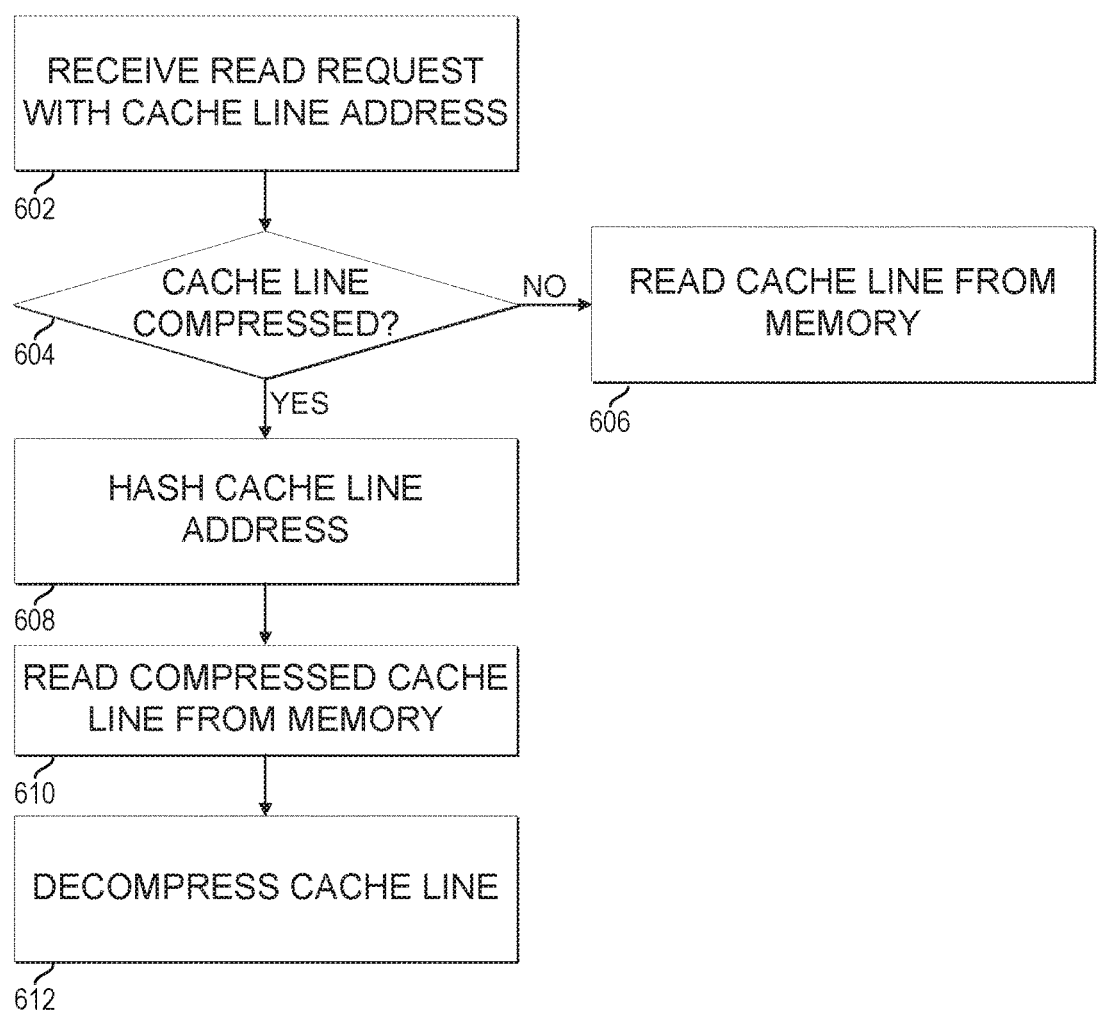
FIG. 6 illustrates a flow for reading compressed data in accordance with certain embodiments.

FIG. 6 illustrates a flow for reading compressed data in accordance with certain embodiments. In various embodiments, the flow may be performed by compression engine 108, memory controller 110, a combination of the compression engine 108 and memory controller 110, and/or other suitable logic comprising circuitry.

At 602, a read request with a cache line address is received (e.g., after a miss at a lower level cache, such as an L1 cache or an L2 cache). At 604, a determination is made as to whether the cache line is stored in a compressed fashion in memory 112 (e.g., based on a compression flag 114). If the cache line is not compressed, the cache line is read from memory 606 in a normal fashion. If the cache line is compressed at 604, the cache line address may be hashed at 608 to determine which channel to read the compressed cache line from. At 610, the compressed cache line is read from memory over the selected channel. At 612, the cache line is decompressed.

The flows described in FIGS. 4-6 are merely representative of operations that may occur in particular embodiments. In other embodiments, additional operations may be performed. Various embodiments of the present disclosure contemplate any suitable signaling mechanisms for accomplishing the functions described herein. Some of the operations illustrated in FIGS. 4-6 may be repeated, combined, modified, or omitted where appropriate. Additionally, operations may be performed in any suitable order without departing from the scope of particular embodiments. As one example, two or more of operations 504, 510, and 512 may be performed simultaneously in some embodiments.

The figures below detail exemplary architectures and systems to implement embodiments of the above. For example, compression engine 108 may be included within or coupled to any of the processors or systems illustrated below. In some embodiments, one or more hardware components and/or instructions described above are emulated as detailed below, or implemented as software modules.

FIG. 7 illustrates a field programmable gate array (FPGA) 700 in accordance with certain embodiments. In a particular embodiment, compression engine 108 may be implemented by an FPGA 700 (e.g., the functionality of the compression engine 108 may be implemented by circuitry of operational logic 704). An FPGA may be a semiconductor device that includes configurable logic. An FPGA may be programmed via a data structure (e.g., a bitstream) having any suitable format that defines how the logic of the FPGA is to be configured. An FPGA may be reprogrammed any number of times after the FPGA is manufactured.

In the depicted embodiment, FPGA 700 includes configurable logic 702, operational logic 704, communication controller 706, and memory controller 710. Configurable logic 702 may be programmed to implement one or more kernels. A kernel may comprise configured logic of the FPGA that may receive a set of one or more inputs, process the set of inputs using the configured logic, and provide a set of one or more outputs. The kernel may perform any suitable type of processing. In various embodiments, a kernel may comprise a prefix decoder engine. Some FPGAs 700 may be limited to executing a single kernel at a time while other FPGAs may be capable of executing multiple kernels simultaneously. The configurable logic 702 may include any suitable logic, such as any suitable type of logic gates (e.g., AND gates, XOR gates) or combinations of logic gates (e.g., flip flops, look up tables, adders, multipliers, multiplexers, demultiplexers). In some embodiments, the logic is configured (at least in part) through programmable interconnects between logic components of the FPGA.

Operational logic 704 may access a data structure defining a kernel and configure the configurable logic 702 based on the data structure and perform other operations of the FPGA. In some embodiments, operational logic 704 may write control bits to memory (e.g., nonvolatile flash memory or SRAM based memory) of the FPGA 700 based on the data structure, wherein the control bits operate to configure the logic (e.g., by activating or deactivating particular interconnects between portions of the configurable logic). The operational logic 704 may include any suitable logic (which may be implemented in configurable logic or fixed logic), such as one or more memory devices including any suitable type of memory (e.g., random access memory (RAM)), one or more transceivers, clocking circuitry, one or more processors located on the FPGA, one or more controllers, or other suitable logic.

Communication controller 706 may enable FPGA 700 to communicate with other components (e.g., a compression engine) of a computer system (e.g., to receive commands to compress data sets). Memory controller 710 may enable the FPGA to read data (e.g., operands or results) from or write data to memory of a computer system. In various embodiments, memory controller 710 may comprise a direct memory access (DMA) controller.

Processor cores may be implemented in different ways, for different purposes, and in different processors. For instance, implementations of such cores may include: 1) a general purpose in-order core intended for general-purpose computing; 2) a high performance general purpose out-of-order core intended for general-purpose computing; 3) a special purpose core intended primarily for graphics and/or scientific (throughput) computing. Implementations of different processors may include: 1) a CPU including one or more general purpose in-order cores intended for general-purpose computing and/or one or more general purpose out-of-order cores intended for general-purpose computing; and 2) a coprocessor including one or more special purpose cores intended primarily for graphics and/or scientific (throughput). Such different processors lead to different computer system architectures, which may include: 1) the coprocessor on a separate chip from the CPU; 2) the coprocessor on a separate die in the same package as a CPU; 3) the coprocessor on the same die as a CPU (in which case, such a coprocessor is sometimes referred to as special purpose logic, such as integrated graphics and/or scientific (throughput) logic, or as special purpose cores); and 4) a system on a chip that may include on the same die the described CPU (sometimes referred to as the application core(s) or application processor(s)), the above described coprocessor, and additional functionality. Exemplary core architectures are described next, followed by descriptions of exemplary processors and computer architectures.

FIG. 8A is a block diagram illustrating both an exemplary in-order pipeline and an exemplary register renaming, out-of-order issue/execution pipeline according to embodiments of the disclosure. FIG. 8B is a block diagram illustrating both an exemplary embodiment of an in-order architecture core and an exemplary register renaming, out-of-order issue/execution architecture core to be included in a processor according to embodiments of the disclosure. The solid lined boxes in FIGS. 8A-B illustrate the in-order pipeline and in-order core, while the optional addition of the dashed lined boxes illustrates the register renaming, out-of-order issue/execution pipeline and core. Given that the in-order aspect is a subset of the out-of-order aspect, the out-of-order aspect will be described.

In FIG. 8A, a processor pipeline 800 includes a fetch stage 802, a length decode stage 804, a decode stage 806, an allocation stage 808, a renaming stage 810, a scheduling (also known as a dispatch or issue) stage 812, a register read/memory read stage 814, an execute stage 816, a write back/memory write stage 818, an exception handling stage 822, and a commit stage 824.

FIG. 8B shows processor core 890 including a front end unit 830 coupled to an execution engine unit 850, and both are coupled to a memory unit 870. The core 890 may be a reduced instruction set computing (RISC) core, a complex instruction set computing (CISC) core, a very long instruction word (VLIW) core, or a hybrid or alternative core type. As yet another option, the core 890 may be a special-purpose core, such as, for example, a network or communication core, compression and/or decompression engine, coprocessor core, general purpose computing graphics processing unit (GPGPU) core, graphics core, or the like.

The front end unit 830 includes a branch prediction unit 832 coupled to an instruction cache unit 834, which is coupled to an instruction translation lookaside buffer (TLB) 836, which is coupled to an instruction fetch unit 838, which is coupled to a decode unit 840. The decode unit 840 (or decoder) may decode instructions, and generate as an output one or more micro-operations, micro-code entry points, microinstructions, other instructions, or other control signals, which are decoded from, or which otherwise reflect, or are derived from, the original instructions. The decode unit 840 may be implemented using various different mechanisms. Examples of suitable mechanisms include, but are not limited to, look-up tables, hardware implementations, programmable logic arrays (PLAs), microcode read only memories (ROMs), etc. In one embodiment, the core 890 includes a microcode ROM or other medium that stores microcode for certain macroinstructions (e.g., in decode unit 840 or otherwise within the front end unit 830). The decode unit 840 is coupled to a rename/allocator unit 852 in the execution engine unit 850.

The execution engine unit 850 includes the rename/allocator unit 852 coupled to a retirement unit 854 and a set of one or more scheduler unit(s) 856. The scheduler unit(s) 856 represents any number of different schedulers, including reservations stations, central instruction window, etc. The scheduler unit(s) 856 is coupled to the physical register file(s) unit(s) 858. Each of the physical register file(s) units 858 represents one or more physical register files, different ones of which store one or more different data types, such as scalar integer, scalar floating point, packed integer, packed floating point, vector integer, vector floating point, status (e.g., an instruction pointer that is the address of the next instruction to be executed), etc. In one embodiment, the physical register file(s) unit 858 comprises a vector registers unit, a write mask registers unit, and a scalar registers unit. These register units may provide architectural vector registers, vector mask registers, and general purpose registers. The physical register file(s) unit(s) 858 is overlapped by the retirement unit 854 to illustrate various ways in which register renaming and out-of-order execution may be implemented (e.g., using a reorder buffer(s) and a retirement register file(s); using a future file(s), a history buffer(s), and a retirement register file(s); using a register maps and a pool of registers; etc.). The retirement unit 854 and the physical register file(s) unit(s) 858 are coupled to the execution cluster(s) 860. The execution cluster(s) 860 includes a set of one or more execution units 862 and a set of one or more memory access units 864. The execution units 862 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions. The scheduler unit(s) 856, physical register file(s) unit(s) 858, and execution cluster(s) 860 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 864). It should also be understood that where separate pipelines are used, one or more of these pipelines may be out-of-order issue/execution and the rest in-order.

The set of memory access units 864 is coupled to the memory unit 870, which includes a data TLB unit 872 coupled to a data cache unit 874 coupled to a level 2 (L2) cache unit 876. In one exemplary embodiment, the memory access units 864 may include a load unit, a store address unit, and a store data unit, each of which is coupled to the data TLB unit 872 in the memory unit 870. The instruction cache unit 834 is further coupled to a level 2 (L2) cache unit 876 in the memory unit 870. The L2 cache unit 876 is coupled to one or more other levels of cache and eventually to a main memory.

By way of example, the exemplary register renaming, out-of-order issue/execution core architecture may implement the pipeline 800 as follows: 1) the instruction fetch 838 performs the fetch and length decoding stages 802 and 804; 2) the decode unit 840 performs the decode stage 806; 3) the rename/allocator unit 852 performs the allocation stage 808 and renaming stage 810; 4) the scheduler unit(s) 856 performs the schedule stage 812; 5) the physical register file(s) unit(s) 858 and the memory unit 870 perform the register read/memory read stage 814; the execution cluster 860 perform the execute stage 816; 6) the memory unit 870 and the physical register file(s) unit(s) 858 perform the write back/memory write stage 818; 7) various units may be involved in the exception handling stage 822; and 8) the retirement unit 854 and the physical register file(s) unit(s) 858 perform the commit stage 824.

The core 890 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.), including the instruction(s) described herein. In one embodiment, the core 890 includes logic to support a packed data instruction set extension (e.g., AVX1, AVX2), thereby allowing the operations used by many multimedia applications to be performed using packed data.

It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes separate instruction and data cache units 834/874 and a shared L2 cache unit 876, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

FIGS. 9A-B illustrate a block diagram of a more specific exemplary in-order core architecture, which core would be one of several logic blocks (potentially including other cores of the same type and/or different types) in a chip. The logic blocks communicate through a high-bandwidth interconnect network (e.g., a ring network) with some fixed function logic, memory I/O interfaces, and other necessary I/O logic, depending on the application.

FIG. 9A is a block diagram of a single processor core, along with its connection to the on-die interconnect network 902 and with its local subset of the Level 2 (L2) cache 904, according to various embodiments. In one embodiment, an instruction decoder 900 supports the x86 instruction set with a packed data instruction set extension. An L1 cache 906 allows low-latency accesses to cache memory into the scalar and vector units. While in one embodiment (to simplify the design), a scalar unit 908 and a vector unit 910 use separate register sets (respectively, scalar registers 912 and vector registers 914) and data transferred between them is written to memory and then read back in from a level 1 (L1) cache 906, alternative embodiments may use a different approach (e.g., use a single register set or include a communication path that allow data to be transferred between the two register files without being written and read back).

The local subset of the L2 cache 904 is part of a global L2 cache that is divided into separate local subsets (in some embodiments one per processor core). Each processor core has a direct access path to its own local subset of the L2 cache 904. Data read by a processor core is stored in its L2 cache subset 904 and can be accessed quickly, in parallel with other processor cores accessing their own local L2 cache subsets. Data written by a processor core is stored in its own L2 cache subset 904 and is flushed from other subsets, if necessary. The ring network ensures coherency for shared data. The ring network is bi-directional to allow agents such as processor cores, L2 caches and other logic blocks to communicate with each other within the chip. In a particular embodiment, each ring data-path is 1012-bits wide per direction.

FIG. 9B is an expanded view of part of the processor core in FIG. 9A according to embodiments. FIG. 9B includes an L1 data cache 906A (part of the L1 cache 906), as well as more detail regarding the vector unit 910 and the vector registers 914. Specifically, the vector unit 910 is a 16-wide vector processing unit (VPU) (see the 16-wide ALU 928), which executes one or more of integer, single-precision float, and double-precision float instructions. The VPU supports swizzling the register inputs with swizzle unit 920, numeric conversion with numeric convert units 922A-B, and replication with replication unit 924 on the memory input. Write mask registers 926 allow predicating resulting vector writes.

Figure 10:
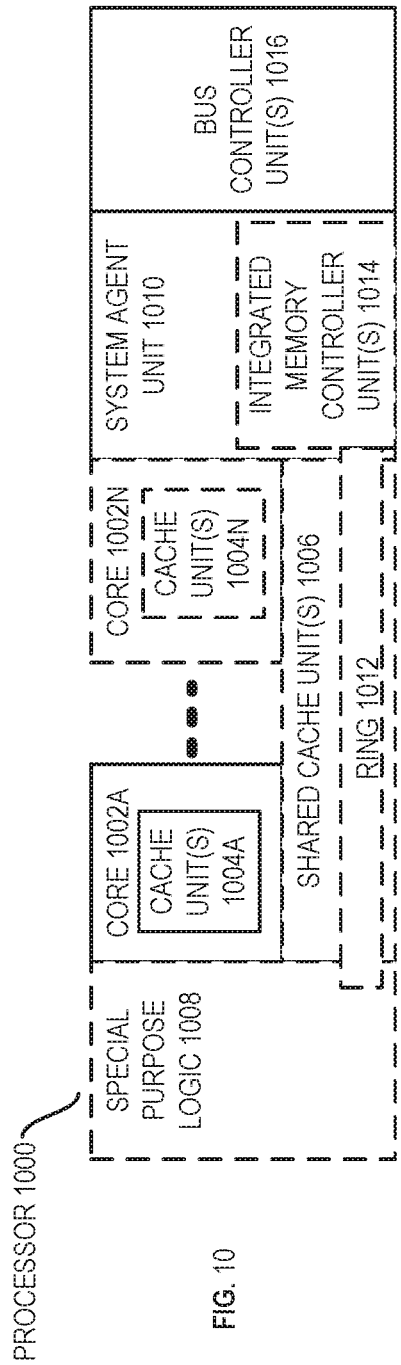
FIG. 10 is a block diagram of a processor that may have more than one core, may have an integrated memory controller, and may have integrated graphics in accordance with certain embodiments.

FIG. 10 is a block diagram of a processor 1000 that may have more than one core, may have an integrated memory controller, and may have integrated graphics according to various embodiments. The solid lined boxes in FIG. 10 illustrate a processor 1000 with a single core 1002A, a system agent 1010, and a set of one or more bus controller units 1016; while the optional addition of the dashed lined boxes illustrates an alternative processor 1000 with multiple cores 1002A-N, a set of one or more integrated memory controller unit(s) 1014 in the system agent unit 1010, and special purpose logic 1008.

Thus, different implementations of the processor 1000 may include: 1) a CPU with the special purpose logic 1008 being integrated graphics and/or scientific (throughput) logic (which may include one or more cores), and the cores 1002A-N being one or more general purpose cores (e.g., general purpose in-order cores, general purpose out-of-order cores, or a combination of the two); 2) a coprocessor with the cores 1002A-N being a large number of special purpose cores intended primarily for graphics and/or scientific (throughput); and 3) a coprocessor with the cores 1002A-N being a large number of general purpose in-order cores. Thus, the processor 1000 may be a general-purpose processor, coprocessor or special-purpose processor, such as, for example, a network or communication processor, compression and/or decompression engine, graphics processor, GPGPU (general purpose graphics processing unit), a high-throughput many integrated core (MIC) coprocessor (e.g., including 30 or more cores), embedded processor, or other fixed or configurable logic that performs logical operations. The processor may be implemented on one or more chips. The processor 1000 may be a part of and/or may be implemented on one or more substrates using any of a number of process technologies, such as, for example, BiCMOS, CMOS, or NMOS.

In various embodiments, a processor may include any number of processing elements that may be symmetric or asymmetric. In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core may refer to logic located on an integrated circuit capable of maintaining an independent architectural state, wherein each independently maintained architectural state is associated with at least some dedicated execution resources. A hardware thread may refer to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

The memory hierarchy includes one or more levels of cache within the cores, a set or one or more shared cache units 1006, and external memory (not shown) coupled to the set of integrated memory controller units 1014. The set of shared cache units 1006 may include one or more mid-level caches, such as level 2 (L2), level 3 (L3), level 4 (L4), or other levels of cache, a last level cache (LLC), and/or combinations thereof. While in one embodiment a ring based interconnect unit 1012 interconnects the special purpose logic (e.g., integrated graphics logic) 1008, the set of shared cache units 1006, and the system agent unit 1010/ integrated memory controller unit(s) 1014, alternative embodiments may use any number of well-known techniques for interconnecting such units. In one embodiment, coherency is maintained between one or more cache units 1006 and cores 1002A-N.

In some embodiments, one or more of the cores 1002A-N are capable of multithreading. The system agent 1010 includes those components coordinating and operating cores 1002A-N. The system agent unit 1010 may include for example a power control unit (PCU) and a display unit. The PCU may be or include logic and components needed for regulating the power state of the cores 1002A-N and the special purpose logic 1008. The display unit is for driving one or more externally connected displays.

The cores 1002A-N may be homogenous or heterogeneous in terms of architecture instruction set; that is, two or more of the cores 1002A-N may be capable of executing the same instruction set, while others may be capable of executing only a subset of that instruction set or a different instruction set.

FIGS. 11-14 are block diagrams of exemplary computer architectures. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable for performing the methods described in this disclosure. In general, a huge variety of systems or electronic devices capable of incorporating a processor and/or other execution logic as disclosed herein are generally suitable.

Figure 11:
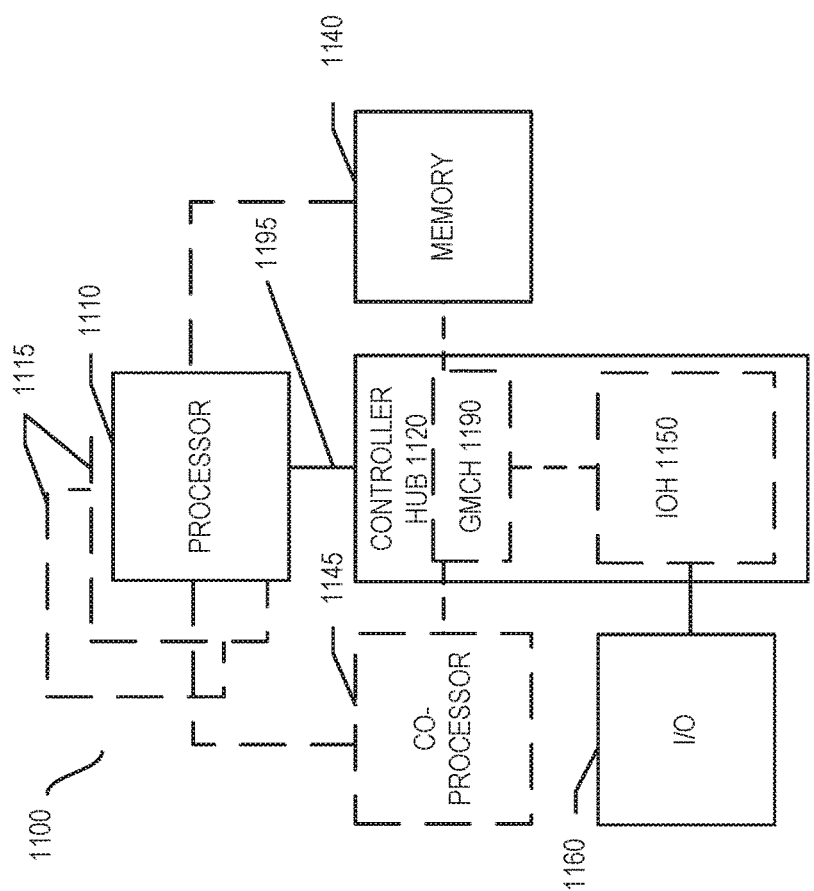
FIGS. 11, 12, 13, and 14 are block diagrams of exemplary computer architectures in accordance with certain embodiments.

FIG. 11 depicts a block diagram of a system 1100 in accordance with one embodiment of the present disclosure. The system 1100 may include one or more processors 1110, 1115, which are coupled to a controller hub 1120. In one embodiment the controller hub 1120 includes a graphics memory controller hub (GMCH) 1190 and an Input/Output Hub (IOH) 1150 (which may be on separate chips or the same chip); the GMCH 1190 includes memory and graphics controllers coupled to memory 1140 and a coprocessor 1145; the IOH 1150 couples input/output (I/O) devices 1160 to the GMCH 1190. Alternatively, one or both of the memory and graphics controllers are integrated within the processor (as described herein), the memory 1140 and the coprocessor 1145 are coupled directly to the processor 1110, and the controller hub 1120 is a single chip comprising the IOH 1150.

The optional nature of additional processors 1115 is denoted in FIG. 11 with broken lines. Each processor 1110, 1115 may include one or more of the processing cores described herein and may be some version of the processor 1000.

The memory 1140 may be, for example, dynamic random access memory (DRAM), phase change memory (PCM), other suitable memory, or any combination thereof. The memory 1140 may store any suitable data, such as data used by processors 1110, 1115 to provide the functionality of computer system 1100. For example, data associated with programs that are executed or files accessed by processors 1110, 1115 may be stored in memory 1140. In various embodiments, memory 1140 may store data and/or sequences of instructions that are used or executed by processors 1110, 1115.

In at least one embodiment, the controller hub 1120 communicates with the processor(s) 1110, 1115 via a multi-drop bus, such as a frontside bus (FSB), point-to-point interface such as QuickPath Interconnect (QPI), or similar connection 1195.

In one embodiment, the coprocessor 1145 is a special-purpose processor, such as, for example, a high-throughput MIC processor, a network or communication processor, compression and/or decompression engine, graphics processor, GPGPU, embedded processor, or the like. In one embodiment, controller hub 1120 may include an integrated graphics accelerator.

There can be a variety of differences between the physical resources 1110, 1115 in terms of a spectrum of metrics of merit including architectural, microarchitectural, thermal, power consumption characteristics, and the like.

In one embodiment, the processor 1110 executes instructions that control data processing operations of a general type. Embedded within the instructions may be coprocessor instructions. The processor 1110 recognizes these coprocessor instructions as being of a type that should be executed by the attached coprocessor 1145. Accordingly, the processor 1110 issues these coprocessor instructions (or control signals representing coprocessor instructions) on a coprocessor bus or other interconnect, to coprocessor 1145. Coprocessor(s) 1145 accept and execute the received coprocessor instructions.

Figure 12:
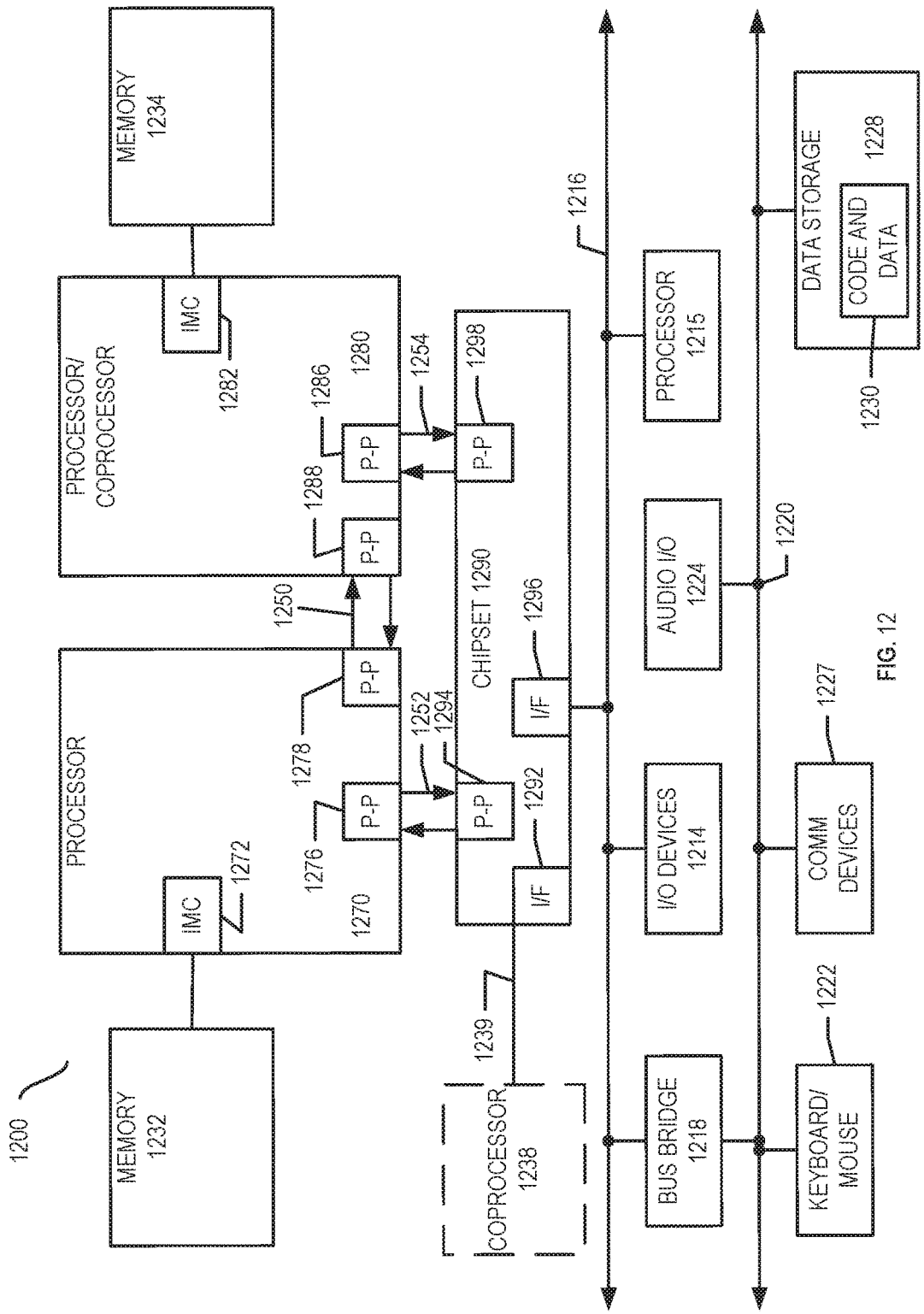

FIG. 12 depicts a block diagram of a first more specific exemplary system 1200 in accordance with an embodiment of the present disclosure. As shown in FIG. 12, multiprocessor system 1200 is a point-to-point interconnect system, and includes a first processor 1270 and a second processor 1280 coupled via a point-to-point interconnect 1250. Each of processors 1270 and 1280 may be some version of the processor 1000. In one embodiment of the disclosure, processors 1270 and 1280 are respectively processors 1110 and 1115, while coprocessor 1238 is coprocessor 1145. In another embodiment, processors 1270 and 1280 are respectively processor 1110 and coprocessor 1145.

Processors 1270 and 1280 are shown including integrated memory controller (IMC) units 1272 and 1282, respectively. Processor 1270 also includes as part of its bus controller units point-to-point (P-P) interfaces 1276 and 1278; similarly, second processor 1280 includes P-P interfaces 1286 and 1288. Processors 1270, 1280 may exchange information via a point-to-point (P-P) interface 1250 using P-P interface circuits 1278, 1288. As shown in FIG. 12, IMCs 1272 and 1282 couple the processors to respective memories, namely a memory 1232 and a memory 1234, which may be portions of main memory locally attached to the respective processors.

Processors 1270, 1280 may each exchange information with a chipset 1290 via individual P-P interfaces 1252, 1254 using point to point interface circuits 1276, 1294, 1286, 1298. Chipset 1290 may optionally exchange information with the coprocessor 1238 via a high-performance interface 1239. In one embodiment, the coprocessor 1238 is a special-purpose processor, such as, for example, a high-throughput MIC processor, a network or communication processor, compression and/or decompression engine, graphics processor, GPGPU, embedded processor, or the like.

A shared cache (not shown) may be included in either processor or outside of both processors, yet connected with the processors via a P-P interconnect, such that either or both processors' local cache information may be stored in the shared cache if a processor is placed into a low power mode.

Chipset 1290 may be coupled to a first bus 1216 via an interface 1296. In one embodiment, first bus 1216 may be a Peripheral Component Interconnect (PCI) bus, or a bus such as a PCI Express bus or another third generation I/O interconnect bus, although the scope of the present disclosure is not so limited.

As shown in FIG. 12, various I/O devices 1214 may be coupled to first bus 1216, along with a bus bridge 1218 which couples first bus 1216 to a second bus 1220. In one embodiment, one or more additional processor(s) 1215, such as coprocessors, high-throughput MIC processors, GPGPU's, accelerators (such as, e.g., graphics accelerators or digital signal processing (DSP) units), field programmable gate arrays, or any other processor, are coupled to first bus 1216. In one embodiment, second bus 1220 may be a low pin count (LPC) bus. Various devices may be coupled to a second bus 1220 including, for example, a keyboard and/or mouse 1222, communication devices 1227 and a storage unit 1228 such as a disk drive or other mass storage device which may include instructions/code and data 1230, in one embodiment. Further, an audio I/O 1224 may be coupled to the second bus 1220. Note that other architectures are contemplated by this disclosure. For example, instead of the point-to-point architecture of FIG. 12, a system may implement a multi-drop bus or other such architecture.

Figure 13:
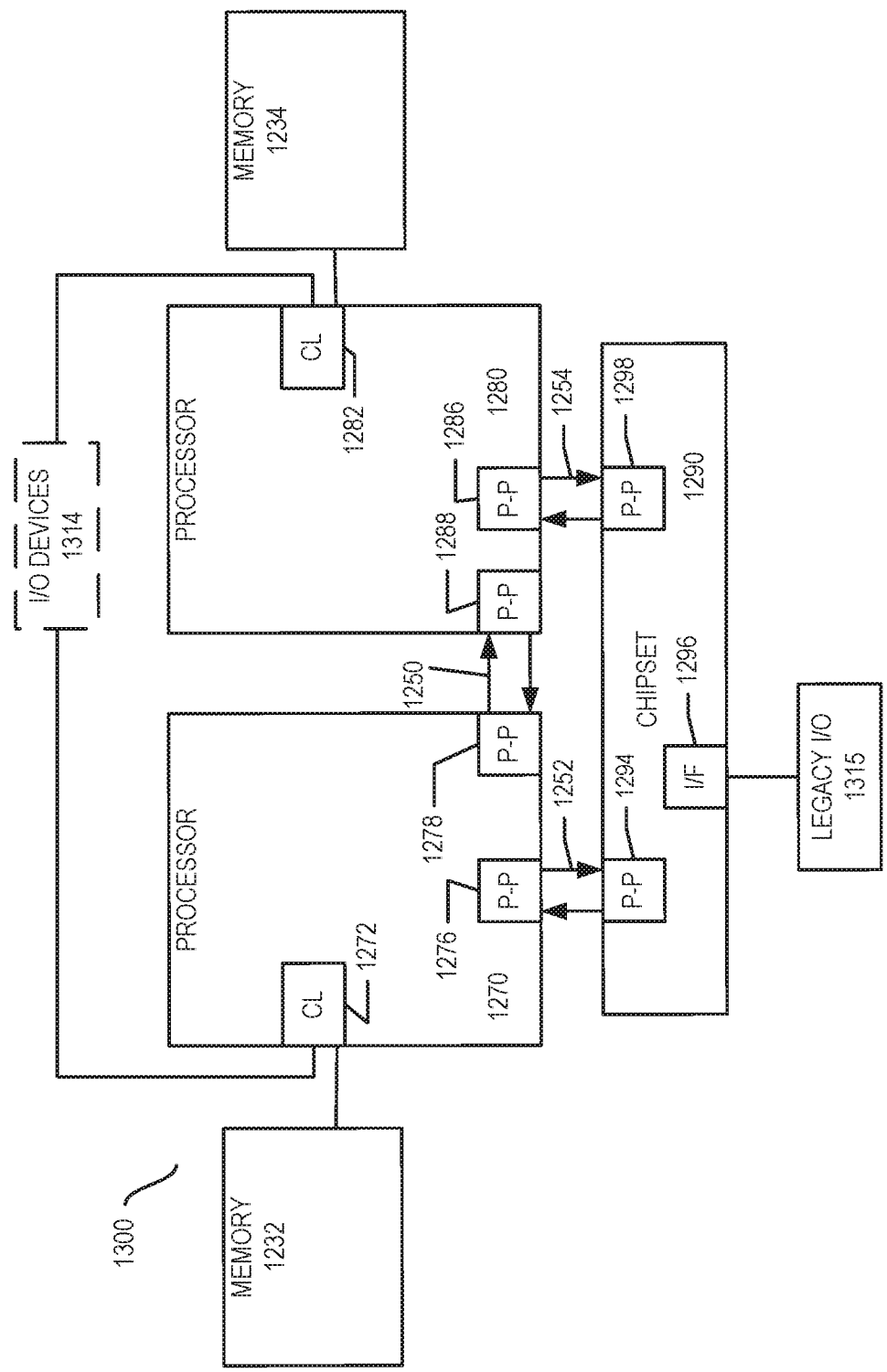

FIG. 13 depicts a block diagram of a second more specific exemplary system 1300 in accordance with an embodiment of the present disclosure. Similar elements in FIGS. 12 and 13 bear similar reference numerals, and certain aspects of FIG. 12 have been omitted from FIG. 13 in order to avoid obscuring other aspects of FIG. 13.

FIG. 13 illustrates that the processors 1270, 1280 may include integrated memory and I/O control logic ("CL") 1272 and 1282, respectively. Thus, the CL 1272, 1282 include integrated memory controller units and include I/O control logic. FIG. 13 illustrates that not only are the memories 1232, 1234 coupled to the CL 1272, 1282, but also that I/O devices 1314 are also coupled to the control logic 1272, 1282. Legacy I/O devices 1315 are coupled to the chipset 1290.

Figure 14:
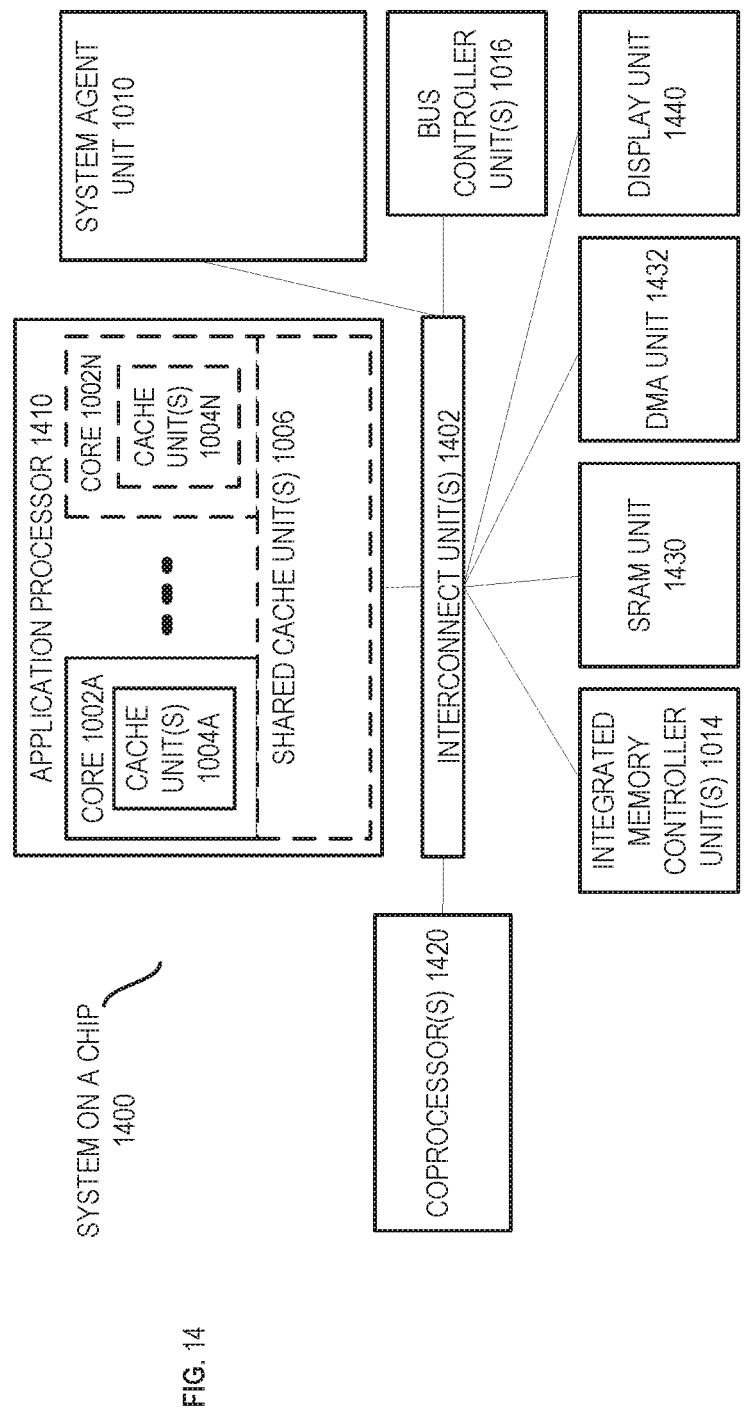

FIG. 14 depicts a block diagram of a SoC 1400 in accordance with an embodiment of the present disclosure. Similar elements in FIG. 10 bear similar reference numerals. Also, dashed lined boxes are optional features on more advanced SoCs. In FIG. 14, an interconnect unit(s) 1402 is coupled to: an application processor 1410 which includes a set of one or more cores 1002A-N and shared cache unit(s) 1006; a system agent unit 1010; a bus controller unit(s) 1016; an integrated memory controller unit(s) 1014; a set or one or more coprocessors 1420 which may include integrated graphics logic, an image processor, an audio processor, and a video processor; an static random access memory (SRAM) unit 1430; a direct memory access (DMA) unit 1432; and a display unit 1440 for coupling to one or more external displays. In one embodiment, the coprocessor(s) 1420 include a special-purpose processor, such as, for example, a network or communication processor, compression and/or decompression engine, GPGPU, a high-throughput MIC processor, embedded processor, or the like.

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

FIG. 15 is a block diagram contrasting the use of a software instruction converter to convert binary instructions in a source instruction set to binary instructions in a target instruction set according to embodiments of the disclosure. In the illustrated embodiment, the instruction converter is a software instruction converter, although alternatively the instruction converter may be implemented in software, firmware, hardware, or various combinations thereof. FIG. 15 shows a program in a high level language 1502 may be compiled using an x86 compiler 1504 to generate x86 binary code 1506 that may be natively executed by a processor with at least one x86 instruction set core 1516. The processor with at least one x86 instruction set core 1516 represents any processor that can perform substantially the same functions as an Intel processor with at least one x86 instruction set core by compatibly executing or otherwise processing (1) a substantial portion of the instruction set of the Intel x86 instruction set core or (2) object code versions of applications or other software targeted to run on an Intel processor with at least one x86 instruction set core, in order to achieve substantially the same result as an Intel processor with at least one x86 instruction set core. The x86 compiler 1504 represents a compiler that is operable to generate x86 binary code 1506 (e.g., object code) that can, with or without additional linkage processing, be executed on the processor with at least one x86 instruction set core 1516. Similarly, FIG. 15 shows the program in the high level language 1502 may be compiled using an alternative instruction set compiler 1508 to generate alternative instruction set binary code 1510 that may be natively executed by a processor without at least one x86 instruction set core 1514 (e.g., a processor with cores that execute the MIPS instruction set of MIPS Technologies of Sunnyvale, Calif. and/or that execute the ARM instruction set of ARM Holdings of Sunnyvale, Calif.). The instruction converter 1512 is used to convert the x86 binary code 1506 into code that may be natively executed by the processor without an x86 instruction set core 1514. This converted code is not likely to be the same as the alternative instruction set binary code 1510 because an instruction converter capable of this is difficult to make; however, the converted code will accomplish the general operation and be made up of instructions from the alternative instruction set. Thus, the instruction converter 1512 represents software, firmware, hardware, or a combination thereof that, through emulation, simulation or any other process, allows a processor or other electronic device that does not have an x86 instruction set processor or core to execute the x86 binary code 1506.

A design may go through various stages, from creation to simulation to fabrication. Data representing a design may represent the design in a number of manners. First, as is useful in simulations, the hardware may be represented using a hardware description language (HDL) or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In some implementations, such data may be stored in a database file format such as Graphic Data System II (GDS II), Open Artwork System Interchange Standard (OASIS), or similar format.

In some implementations, software based hardware models, and HDL and other functional description language objects can include register transfer language (RTL) files, among other examples. Such objects can be machine-parsable such that a design tool can accept the HDL object (or model), parse the HDL object for attributes of the described hardware, and determine a physical circuit and/or on-chip layout from the object. The output of the design tool can be used to manufacture the physical device. For instance, a design tool can determine configurations of various hardware and/or firmware elements from the HDL object, such as bus widths, registers (including sizes and types), memory blocks, physical link paths, fabric topologies, among other attributes that would be implemented in order to realize the system modeled in the HDL object. Design tools can include tools for determining the topology and fabric configurations of system on chip (SoC) and other hardware device. In some instances, the HDL object can be used as the basis for developing models and design files that can be used by manufacturing equipment to manufacture the described hardware. Indeed, an HDL object itself can be provided as an input to manufacturing system software to cause the manufacture of the described hardware.

In any representation of the design, the data representing the design may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present disclosure.

In various embodiments, a medium storing a representation of the design may be provided to a manufacturing system (e.g., a semiconductor manufacturing system capable of manufacturing an integrated circuit and/or related components). The design representation may instruct the system to manufacture a device capable of performing any combination of the functions described above. For example, the design representation may instruct the system regarding which components to manufacture, how the components should be coupled together, where the components should be placed on the device, and/or regarding other suitable specifications regarding the device to be manufactured.

Thus, one or more aspects of at least one embodiment may be implemented by representative instructions stored on a machine-readable medium which represents various logic within the processor, which when read by a machine causes the machine to fabricate logic to perform the techniques described herein. Such representations, often referred to as "IP cores" may be stored on a non-transitory tangible machine readable medium and supplied to various customers or manufacturing facilities to load into the fabrication machines that manufacture the logic or processor.

Embodiments of the mechanisms disclosed herein may be implemented in hardware, software, firmware, or a combination of such implementation approaches. Embodiments of the disclosure may be implemented as computer programs or program code executing on programmable systems comprising at least one processor, a storage system (including volatile and non-volatile memory and/or storage elements), at least one input device, and at least one output device.

Program code, such as code 1230 illustrated in FIG. 12, may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In various embodiments, the language may be a compiled or interpreted language.

The embodiments of methods, hardware, software, firmware or code set forth above may be implemented via instructions or code stored on a machine-accessible, machine readable, computer accessible, or computer readable medium which are executable (or otherwise accessible) by a processing element. A machine-accessible/readable medium includes any mechanism that provides (i.e., stores and/or transmits) information in a form readable by a machine, such as a computer or electronic system. For example, a machine-accessible medium includes random-access memory (RAM), such as static RAM (SRAM) or dynamic RAM (DRAM); ROM; magnetic or optical storage medium; flash memory devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information therefrom.

Instructions used to program logic to perform embodiments of the disclosure may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

Logic may be used to implement any of the functionality of the various components such as processor 100, cores 104, memory interface 106, compression engine 108, memory controller 110, memory 112, compressor 302, decompressor 304, buffer memory 314, and FPGA 700, other component described herein, or any subcomponent of any of these components. "Logic" may refer to hardware, firmware, software and/or combinations of each to perform one or more functions. As an example, logic may include hardware, such as a micro-controller or processor, associated with a non-transitory medium to store code adapted to be executed by the micro-controller or processor. Therefore, reference to logic, in one embodiment, refers to the hardware, which is specifically configured to recognize and/or execute the code to be held on a non-transitory medium. Furthermore, in another embodiment, use of logic refers to the non-transitory medium including the code, which is specifically adapted to be executed by the microcontroller to perform predetermined operations. And as can be inferred, in yet another embodiment, the term logic (in this example) may refer to the combination of the hardware and the non-transitory medium. In various embodiments, logic may include a microprocessor or other processing element operable to execute software instructions, discrete logic such as an application specific integrated circuit (ASIC), a programmed logic device such as a field programmable gate array (FPGA), a memory device containing instructions, combinations of logic devices (e.g., as would be found on a printed circuit board), or other suitable hardware and/or software. Logic may include one or more gates or other circuit components, which may be implemented by, e.g., transistors. In some embodiments, logic may also be fully embodied as software. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in memory devices. Often, logic boundaries that are illustrated as separate commonly vary and potentially overlap. For example, first and second logic may share hardware, software, firmware, or a combination thereof, while potentially retaining some independent hardware, software, or firmware.

Use of the phrase 'to' or 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example, the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

One or more embodiments may provide an apparatus, a processor, a system, a machine readable storage, a machine readable medium, hardware- and/or software-based logic, or a method to store (e.g., by a first memory) a plurality of data elements that are encoded according to a floating point format including a sign field, an exponent field, and a significand field; and to generate (e.g., by a compression engine) a compressed data block that is to include a tag type per data element of the plurality of data elements, wherein responsive to a determination that a first data element includes a value in its exponent field that does not match a value of any entry in a dictionary, a first tag type and an uncompressed value of the first data element are included in the compressed data block; and responsive to a determination that a second data element includes a value in its exponent field that matches a value of a first entry in the dictionary, a second tag type and a compressed value of the second data element are included in the compressed data block.

In at least one embodiment, responsive to a determination that a third data element includes a value in its exponent field that matches a value of a second entry in the dictionary, a third tag type and a compressed value of the data element are included in the compressed data block. In at least one embodiment, responsive to a determination that a fourth data element includes a value in its exponent field that matches a value of a third entry in the dictionary, a fourth tag type and a compressed value of the fourth data element are included in the compressed data block. In at least one embodiment, responsive to a determination that a third data element includes all zero bits in its exponent field and all zero bits in its significand field, a third tag type is included in the compressed data block and no data from the third data element is included in the compressed data block. In at least one embodiment, the dictionary comprises a plurality of entries and each entry of the dictionary stores a respective exponent value. In at least one embodiment, the second tag type indicates a position of the first entry within a plurality of entries of the dictionary. In at least one embodiment, the dictionary comprises two entries and the dictionary is indexed by a least significant bit of the exponent field of the first data element. In at least one embodiment, the plurality of data elements form a first data block, the dictionary is updated prior to compression of the first data block based on data elements of a second data block that is compressed prior to the first data block, and the dictionary is not updated during compression of the first data block. In at least one embodiment, the second data block is compressed (e.g., by the compression engine) immediately prior to compression of the first data block. In at least one embodiment, the compressed value of the second data element is a sign value and significand value of the second data element. In at least one embodiment, the compression engine or other component is further to pad one or more bits to an end of the compressed block to cause the compressed block to end at a byte boundary. In at least one embodiment, a processor further comprises a memory controller to send the compressed block to a second memory for storage therein. In at least one embodiment, the compression engine or other component is to initialize a plurality of entries of the dictionary based on a workload type associated with the plurality of data elements. In at least one embodiment, the compression engine or other component is to initialize a plurality of entries of the dictionary based on a histogram of a frequency of exponents encountered in one or more data sets compressed prior to compression of the plurality of data elements.

In at least one embodiment, at least one machine readable storage medium has instructions stored thereon, the instructions when executed by a machine to cause the machine to store a plurality of data elements that are encoded according to a floating point format including a sign field, an exponent field, and a significand field; and generate a compressed data block based on the plurality of data elements, wherein the compressed data block is to include a tag type per data element of the plurality of data elements, wherein responsive to a determination that a first data element includes a value in its exponent field that does not match a value of any entry in a dictionary, a first tag type and an uncompressed value of the first data element are included in the compressed data block; and responsive to a determination that a second data element includes a value in its exponent field that matches a value of a first entry in the dictionary, a second tag type and a compressed value of the second data element are included in the compressed data block.

In at least one embodiment, responsive to a determination that a third data element includes a value in its exponent field that matches a value of a second entry in the dictionary, a third tag type and a compressed value of the third data element are included in the compressed data block.

In at least one embodiment, a system comprises a processor to generate a compressed data block that is to include a tag type per data element of a plurality of data elements that are encoded according to a floating point format including a sign field, an exponent field, and a significand field, wherein responsive to a determination that a first data element includes a value in its exponent field that does not match a value of any entry in a dictionary, a first tag type and an uncompressed value of the first data element are included in the compressed data block, and responsive to a determination that a second data element includes a value in its exponent field that matches a value of a first entry in the dictionary, a second tag type and a compressed value of the second data element are included in the compressed data block; a memory to store the compressed data block; and a plurality of channels to couple the processor to the memory.

In at least one embodiment, a first cache line comprises the plurality of data elements and the processor further comprises a memory controller to: send the compressed data block to the memory via a single channel of the plurality of channels; and send a second cache line that did not achieve a sufficient compression ratio via two channels of the plurality of channels. In at least one embodiment, the memory controller is to select the channel on which to send the compressed data block based on a hash operation performed on an address of the first cache line. In at least one embodiment, the system further comprises a battery communicatively coupled to the processor, a display communicatively coupled to the processor, or a network interface communicatively coupled to the processor.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. A processor comprising:
   a first memory to store a plurality of data elements that are encoded according to a floating point format including a sign field, an exponent field, and a significand field; and
   a compression engine comprising circuitry, the compression engine to generate a compressed data block that is to include a tag type per data element of the plurality of data elements, wherein:
   responsive to a determination that a first data element includes a value in its exponent field that does not match a value of any entry in a dictionary, a first tag type and an uncompressed value of the first data element are included in the compressed data block; and
   responsive to a determination that a second data element includes a value in its exponent field that matches a value of a first entry in the dictionary, a second tag type and a compressed value of the second data element are included in the compressed data block.

2. The processor of claim 1, wherein responsive to a determination that a third data element includes a value in its exponent field that matches a value of a second entry in the dictionary, a third tag type and a compressed value of the data element are included in the compressed data block.

3. The processor of claim 2, wherein responsive to a determination that a fourth data element includes a value in its exponent field that matches a value of a third entry in the dictionary, a fourth tag type and a compressed value of the fourth data element are included in the compressed data block.

4. The processor of claim 1, wherein responsive to a determination that a third data element includes all zero bits in its exponent field and all zero bits in its significand field, a third tag type is included in the compressed data block and no data from the third data element is included in the compressed data block.

5. The processor of claim 1, wherein the dictionary comprises a plurality of entries and each entry of the dictionary stores a respective exponent value.

6. The processor of claim 1, wherein the second tag type indicates a position of the first entry within a plurality of entries of the dictionary.

7. The processor of claim 1, wherein the dictionary comprises two entries and the dictionary is indexed by a least significant bit of the exponent field of the first data element.

8. The processor of claim 1, wherein the plurality of data elements form a first data block, the dictionary is updated prior to compression of the first data block based on data elements of a second data block that is compressed prior to the first data block, and the dictionary is not updated during compression of the first data block.

9. The processor of claim 8, wherein the second data block is compressed by the compression engine immediately prior to compression of the first data block.

10. The processor of claim 1, wherein the compressed value of the second data element is a sign value and significand value of the second data element.

11. The processor of claim 1, wherein the compression engine is further to pad one or more bits to an end of the compressed block to cause the compressed block to end at a byte boundary.

12. The processor of claim 1, wherein the processor further comprises a memory controller to send the compressed block to a second memory for storage therein.

13. The processor of claim 1, the compression engine to initialize a plurality of entries of the dictionary based on a workload type associated with the plurality of data elements.

14. The processor of claim 1, the compression engine to initialize a plurality of entries of the dictionary based on a histogram of a frequency of exponents encountered in one or more data sets compressed prior to compression of the plurality of data elements.

15. At least one non-transitory computer readable storage medium having instructions stored thereon, the instructions when executed by a machine to cause the machine to:
   store a plurality of data elements that are encoded according to a floating point format including a sign field, an exponent field, and a significand field; and
   generate a compressed data block based on the plurality of data elements, wherein the compressed data block is to include a tag type per data element of the plurality of data elements, wherein:
   responsive to a determination that a first data element includes a value in its exponent field that does not match a value of any entry in a dictionary, a first tag type and an uncompressed value of the first data element are included in the compressed data block; and
   responsive to a determination that a second data element includes a value in its exponent field that matches a value of a first entry in the dictionary, a second tag type and a compressed value of the second data element are included in the compressed data block.

16. The at least one non-transitory computer readable storage medium of claim 15, wherein responsive to a determination that a third data element includes a value in its exponent field that matches a value of a second entry in the dictionary, a third tag type and a compressed value of the third data element are included in the compressed data block.

17. A system comprising:
a processor to generate a compressed data block that is to include a tag type per data element of a plurality of data elements that are encoded according to a floating point format including a sign field, an exponent field, and a significand field, wherein responsive to a determination that a first data element includes a value in its exponent field that does not match a value of any entry in a dictionary, a first tag type and an uncompressed value of the first data element are included in the compressed data block, and responsive to a determination that a second data element includes a value in its exponent field that matches a value of a first entry in the dictionary, a second tag type and a compressed value of the second data element are included in the compressed data block;
a memory to store the compressed data block; and
a plurality of channels to couple the processor to the memory.

18. The system of claim 17, wherein a first cache line comprises the plurality of data elements and the processor comprises a memory controller to:
send the compressed data block to the memory via a single channel of the plurality of channels; and
send a second cache line that did not achieve a sufficient compression ratio via two channels of the plurality of channels.

19. The system of claim 18, wherein the memory controller is to select the channel on which to send the compressed data block based on a hash operation performed on an address of the first cache line.

20. The system of claim 17, further comprising a battery communicatively coupled to the processor, a display communicatively coupled to the processor, or a network interface communicatively coupled to the processor.

* * * * *